(12) United States Patent
Kim et al.

(10) Patent No.: US 12,142,607 B2
(45) Date of Patent: Nov. 12, 2024

(54) SEMICONDUCTOR DEVICE

(71) Applicant: SAMSUNG ELECTRONICS CO., LTD., Suwon-si (KR)

(72) Inventors: Cheol Kim, Suwon-si (KR); Dongkwon Kim, Suwon-si (KR); Hyunho Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 450 days.

(21) Appl. No.: 17/713,834

(22) Filed: Apr. 5, 2022

(65) Prior Publication Data
US 2022/0406775 A1    Dec. 22, 2022

(30) Foreign Application Priority Data
Jun. 22, 2021    (KR) .................... 10-2021-0080703

(51) Int. Cl.
*H01L 27/092*    (2006.01)
*H01L 21/02*    (2006.01)
(Continued)

(52) U.S. Cl.
CPC ........ *H01L 27/092* (2013.01); *H01L 21/0259* (2013.01); *H01L 21/823807* (2013.01);
(Continued)

(58) Field of Classification Search
CPC ............... H01L 27/092; H01L 21/0259; H01L 21/823807; H01L 21/823814;
(Continued)

(56) References Cited

U.S. PATENT DOCUMENTS 9,741,854 B2 *   8/2017   Bai ................ H01L 21/823821
10,651,179 B2    5/2020   Park et al.
(Continued)

FOREIGN PATENT DOCUMENTS

| JP | 2019016773 A | * | 1/2019 | ........... H01L 21/762 |
| KR | 10-2019-0002301 A | | 1/2019 | |
| KR | 20200121154 A | * | 10/2020 | |

*Primary Examiner* — Ermias T Woldegeorgis
(74) *Attorney, Agent, or Firm* — Sughrue Mion, PLLC

(57) ABSTRACT

A semiconductor device includes first and second active regions parallel to each other and respectively extending in a first direction, an isolation layer between the first and second active regions, a first line structure and a second line structure overlapping the first and second active regions and the isolation layer, parallel to each other, and extending in a second direction, a first source/drain region on the first active region, and a second source/drain region on the second active region. The first line structure includes a first gate structure, a second gate structure, and a first insulating separation pattern between the first and second gate structures. The second line structure includes a third gate structure, a fourth gate structure, and a second insulating separation pattern between the third and fourth gate structures. The first and second insulating separation patterns are spaced apart from each other. The first insulating separation pattern has first and second side surfaces opposing each other, and third and fourth side surfaces opposing each other. At least one of the first and second side surfaces and at least one of the third and fourth side surfaces have different side profiles.

20 Claims, 41 Drawing Sheets

(51) Int. Cl.
*H01L 21/8238* (2006.01)
*H01L 29/06* (2006.01)
*H01L 29/417* (2006.01)
*H01L 29/423* (2006.01)
*H01L 29/66* (2006.01)
*H01L 29/786* (2006.01)

(52) U.S. Cl.
CPC ........... *H01L 21/823814* (2013.01); *H01L 21/823871* (2013.01); *H01L 21/823878* (2013.01); *H01L 29/0665* (2013.01); *H01L 29/41733* (2013.01); *H01L 29/42392* (2013.01); *H01L 29/66545* (2013.01); *H01L 29/66742* (2013.01); *H01L 29/78618* (2013.01); *H01L 29/78696* (2013.01)

(58) Field of Classification Search
CPC ..... H01L 21/823871; H01L 21/823878; H01L 29/0665; H01L 29/41733; H01L 29/42392; H01L 29/66545; H01L 29/66742; H01L 29/78618; H01L 29/78696; H01L 29/0847; H01L 29/1079; H01L 29/0673; H01L 21/823475; H01L 29/66439; H01L 21/823437; H01L 21/823481; H01L 29/775; H01L 21/76816; H01L 21/823828; H01L 21/823857; H01L 21/823864; B82Y 10/00

See application file for complete search history.

(56) References Cited

U.S. PATENT DOCUMENTS

| | | | |
|---|---|---|---|
| 10,832,966 B2 | 11/2020 | Park et al. | |
| 10,861,752 B2 | 12/2020 | Perng et al. | |
| 10,916,477 B2 | 2/2021 | Hung et al. | |
| 2017/0162568 A1* | 6/2017 | Song | H01L 29/785 |
| 2018/0040622 A1* | 2/2018 | Yoon | H01L 27/118 |
| 2018/0277547 A1* | 9/2018 | Park | H01L 23/528 |
| 2019/0006345 A1 | 1/2019 | Wang et al. | |
| 2019/0067287 A1* | 2/2019 | Yoo | H01L 27/0924 |
| 2019/0081160 A1* | 3/2019 | Suh | H01L 29/66818 |
| 2020/0066720 A1* | 2/2020 | Song | H01L 29/0649 |
| 2020/0135848 A1* | 4/2020 | Lim | H01L 21/76237 |
| 2020/0144384 A1* | 5/2020 | Sagong | H01L 27/0207 |
| 2020/0185509 A1 | 6/2020 | Zang et al. | |
| 2020/0381563 A1* | 12/2020 | Jang | H01L 29/78696 |
| 2020/0381564 A1* | 12/2020 | Kang | H01L 21/823418 |
| 2021/0036121 A1* | 2/2021 | Lim | H01L 29/78696 |
| 2021/0083072 A1 | 3/2021 | Feng et al. | |
| 2022/0406775 A1* | 12/2022 | Kim | H01L 21/823871 |

\* cited by examiner

SEMICONDUCTOR DEVICE

CROSS-REFERENCE TO RELATED APPLICATION(S)

This application claims priority to Korean Patent Application No. 10-2021-0080703 filed on Jun. 22, 2021 in the Korean Intellectual Property Office, the disclosure of which is incorporated by reference herein in its entirety.

BACKGROUND

The present disclosure relates to a semiconductor device.

As demand for high performance, high speed, and/or multifunctionality in semiconductor devices increases, the degree of integration of semiconductor devices is increasing. In manufacturing a semiconductor device having a fine pattern corresponding to the trend for high integration in a semiconductor device, it is necessary to implement patterns having a fine width or a fine separation distance.

SUMMARY

One or more example embodiments provide a semiconductor device having an improved degree of integration.

In accordance with an aspect of an example embodiment, a semiconductor device includes a substrate; a first active region and a second active region extending parallel to each other in a first direction, on the substrate; an isolation layer disposed between the first active region and the second active region; a line structure disposed on the substrate, overlapping the first and second active regions and the isolation layer, and extending in a second direction that is perpendicular to the first direction; a first source/drain region disposed on the first active region; a second source/drain region disposed on the second active region; a common contact plug disposed on a first side of the line structure, contacting the first source/drain region and the second source/drain region, and overlapping the isolation layer; and an interlayer insulating layer disposed on a second side of the line structure, on the isolation layer, wherein the line structure is disposed on the isolation layer and between the common contact plug and the interlayer insulating layer, the line structure includes a first gate structure overlapping the first active region and extending on the isolation layer, a second gate structure overlapping the second active region and extending on the isolation layer, and an insulating separation pattern disposed between the first gate structure and the second gate structure and extending into the isolation layer, at least a portion of the insulating separation pattern is disposed between the common contact plug and the interlayer insulating layer, the insulating separation pattern has a first side surface and a second side surface opposing each other in the first direction, and a third side surface and a fourth side surface opposing each other in the second direction, at least one of the first side surface and the second side surface of the insulating separation pattern includes a first portion, a second portion on a level lower than the first portion, and a third portion on a level lower than the second portion, and a slope of each of the first portion and the third portion is steeper than a slope of the second portion.

In accordance with an aspect of an example embodiment, a semiconductor device includes a substrate; a first active region and a second active region extending parallel to each other in a first direction, on the substrate; an isolation layer disposed between the first active region and the second active region; a first line structure and a second line structure overlapping the first and second active regions and the isolation layer, and extending parallel to each other in a second direction that is perpendicular to the first direction, on the substrate; a first source/drain region disposed on the first active region; and a second source/drain region disposed on the second active region, wherein the first line structure includes: a first gate structure overlapping the first active region and extending on the isolation layer, a second gate structure overlapping the second active region and extending on the isolation layer, and a first insulating separation pattern disposed between the first gate structure and the second gate structure and extending into the isolation layer, the second line structure includes: a third gate structure overlapping the first active region and extending on the isolation layer, a fourth gate structure overlapping the second active region and extending on the isolation layer, and a second insulating separation pattern disposed between the third gate structure and the fourth gate structure and extending into the isolation layer, the first insulating separation pattern and the second insulating separation pattern are spaced apart from each other, the first insulating separation pattern has a first side surface and a second side surface opposing each other in the first direction, and a third side surface and a fourth side surface opposing each other in the second direction, and at least one of the first side surface and the second side surface of the first insulating separation pattern and at least one of the third side surface and the fourth side surface of the first insulating separation pattern have different side profiles.

In accordance with an aspect of an example embodiment, a semiconductor device includes a substrate; a first active region and a second active region extending parallel to each other in a first direction, on the substrate; an isolation layer disposed between the first active region and the second active region; a plurality of line structures disposed on the substrate, overlapping the first and second active regions and the isolation layer, extending parallel to each other in a second direction perpendicular to the first direction, and spaced apart from each other; a first source/drain region disposed on the first active region; a second source/drain region disposed on the second active region; interlayer insulating layers disposed between adjacent line structures of the plurality of line structures; and a common contact plug, wherein the plurality of line structures includes a first line structure and a second line structure adjacent to each other and spaced apart from each other, the first line structure includes: a first gate structure overlapping the first active region and extending on the isolation layer, a second gate structure overlapping the second active region and extending on the isolation layer, and a first insulating separation pattern disposed between the first gate structure and the second gate structure and extending into the isolation layer, the second line structure includes: a third gate structure overlapping the first active region and extending on the isolation layer, a fourth gate structure overlapping the second active region and extending on the isolation layer, and a second insulating separation pattern disposed between the third gate structure and the fourth gate structure and extending into the isolation layer, the common contact plug includes a portion contacting the first and second source/drain regions and disposed between the first insulating separation pattern and the second insulating separation pattern, the first insulating separation pattern includes a first side surface and a second side surface opposing each other in the first direction, and a third side surface and a fourth side surface opposing each other in the second direction, the first side surface of the first insulating separation pattern includes a first portion, a second portion below the first portion and a third portion below the second portion, the third portion contacts with the isolation layer, the second portion is bent and extended from the first portion in a direction away from a central axis of the first insulating separation pattern, and the first portion is bent and extended from the second portion.

BRIEF DESCRIPTION OF DRAWINGS

The above and other aspects, features, and advantages of the present disclosure will be more apparent from the following detailed description, taken in conjunction with the accompanying drawings, in which.

DETAILED DESCRIPTION

Figure 1:
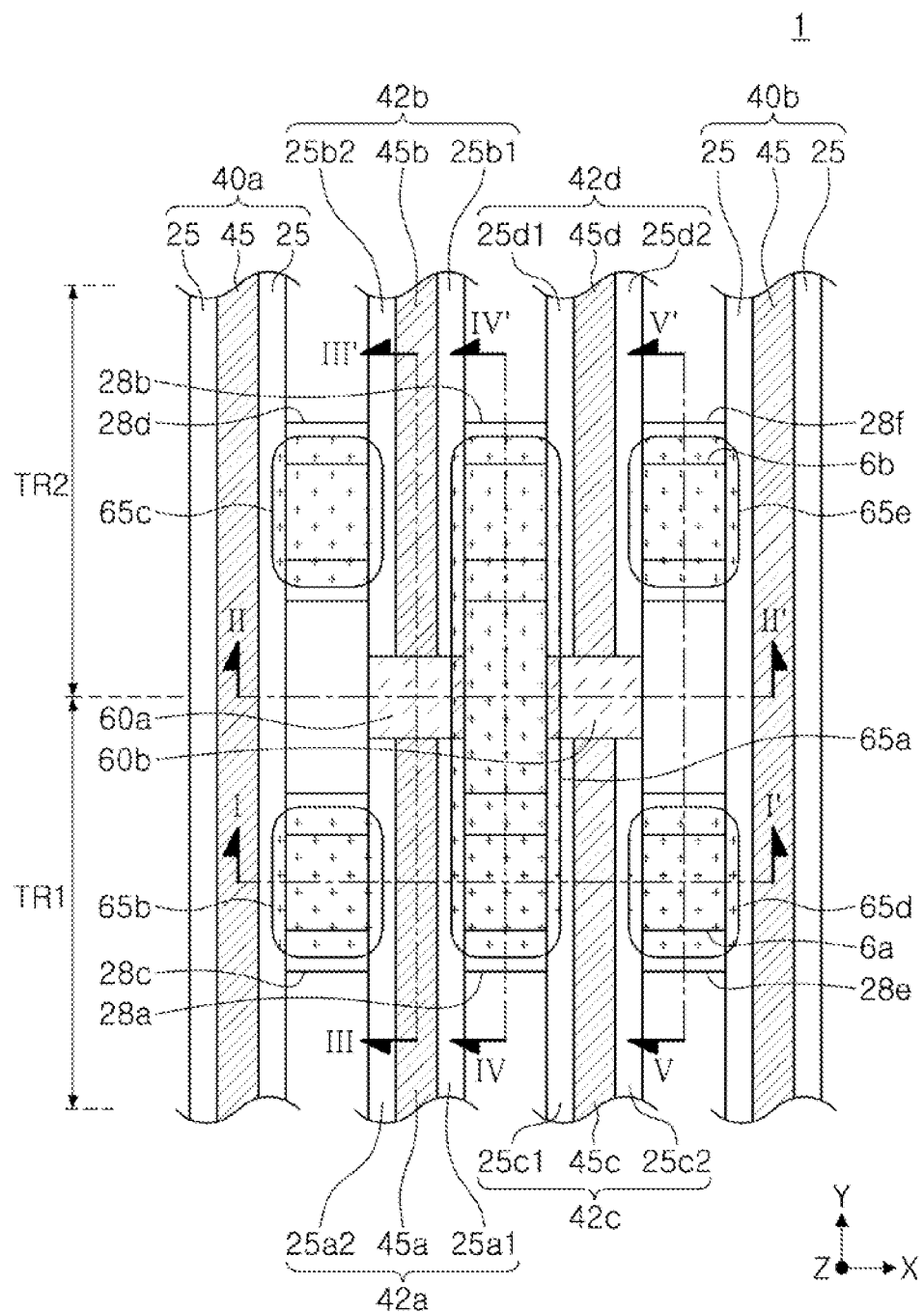
FIGS. 1 and 2A to 2E are diagrams illustrating a semiconductor device according to an example embodiment.
Figure 2A:
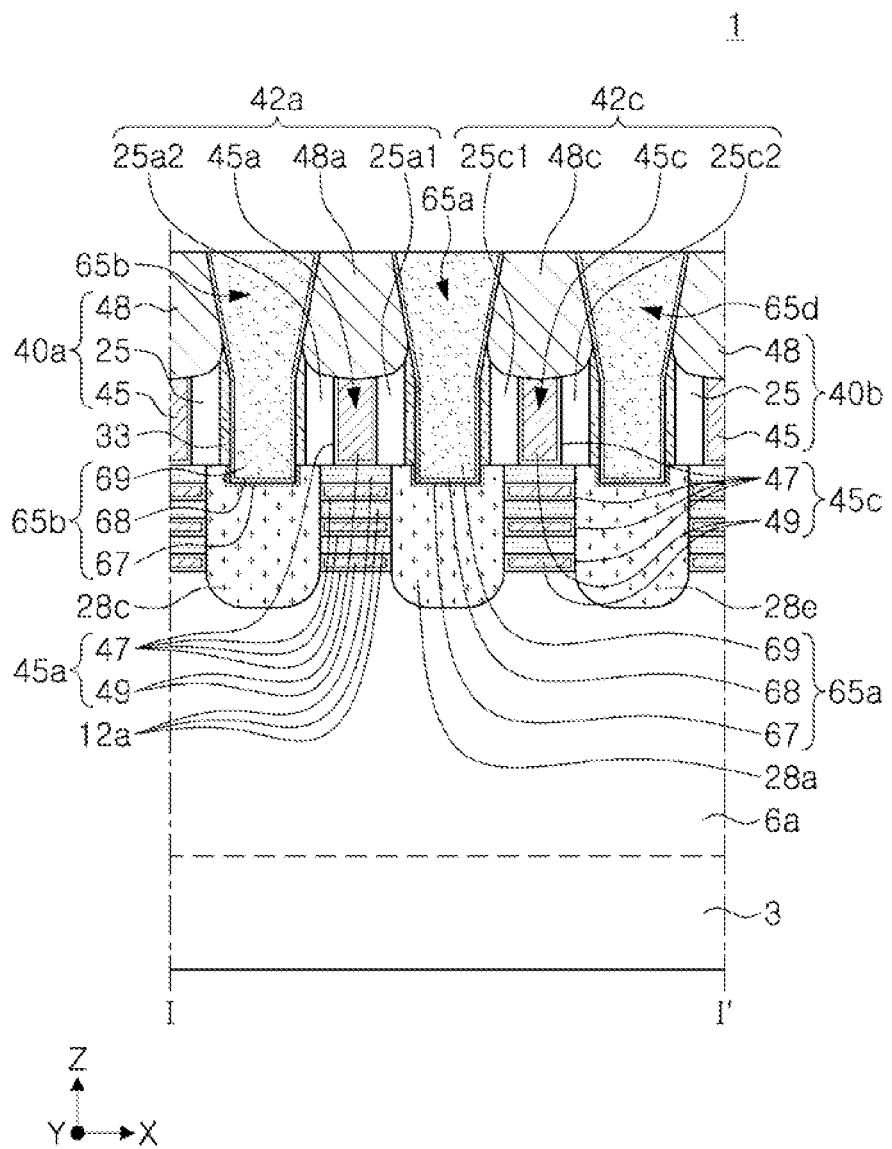
Figure 2B:
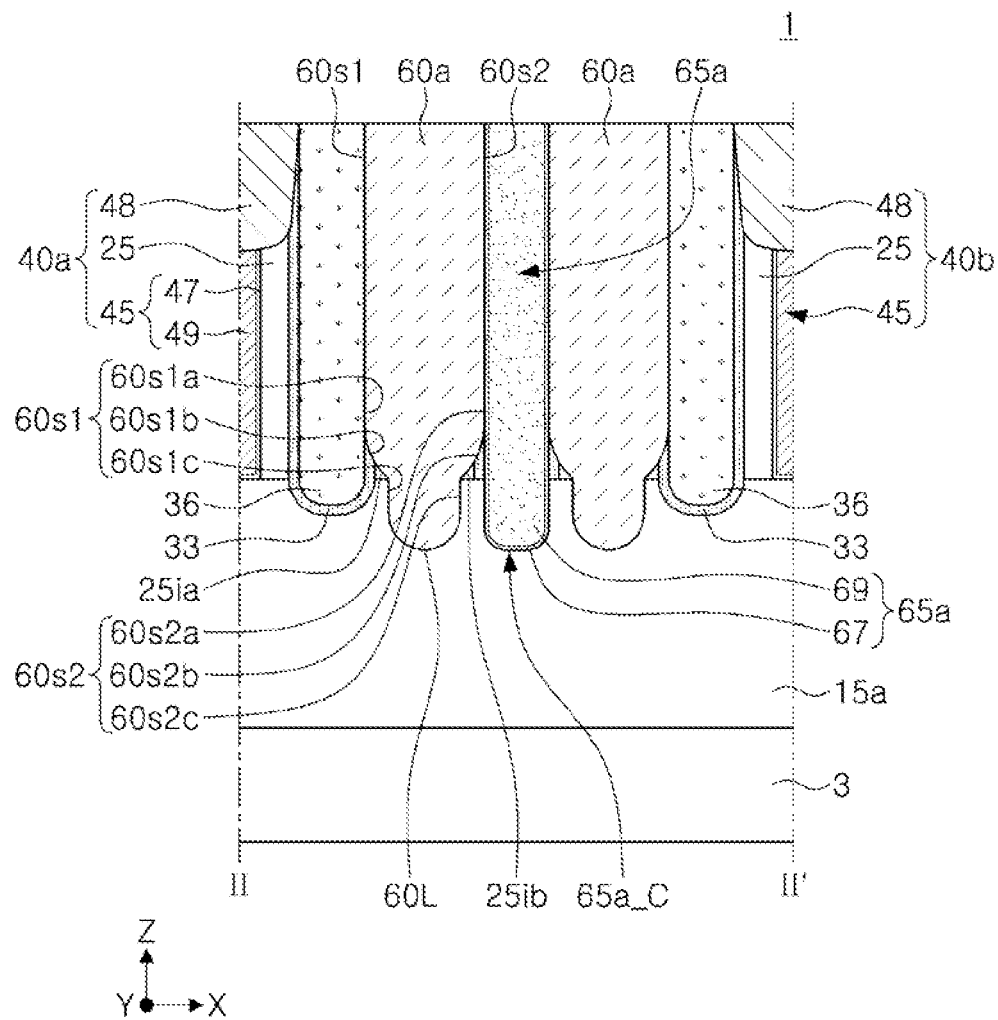
Figure 2C:
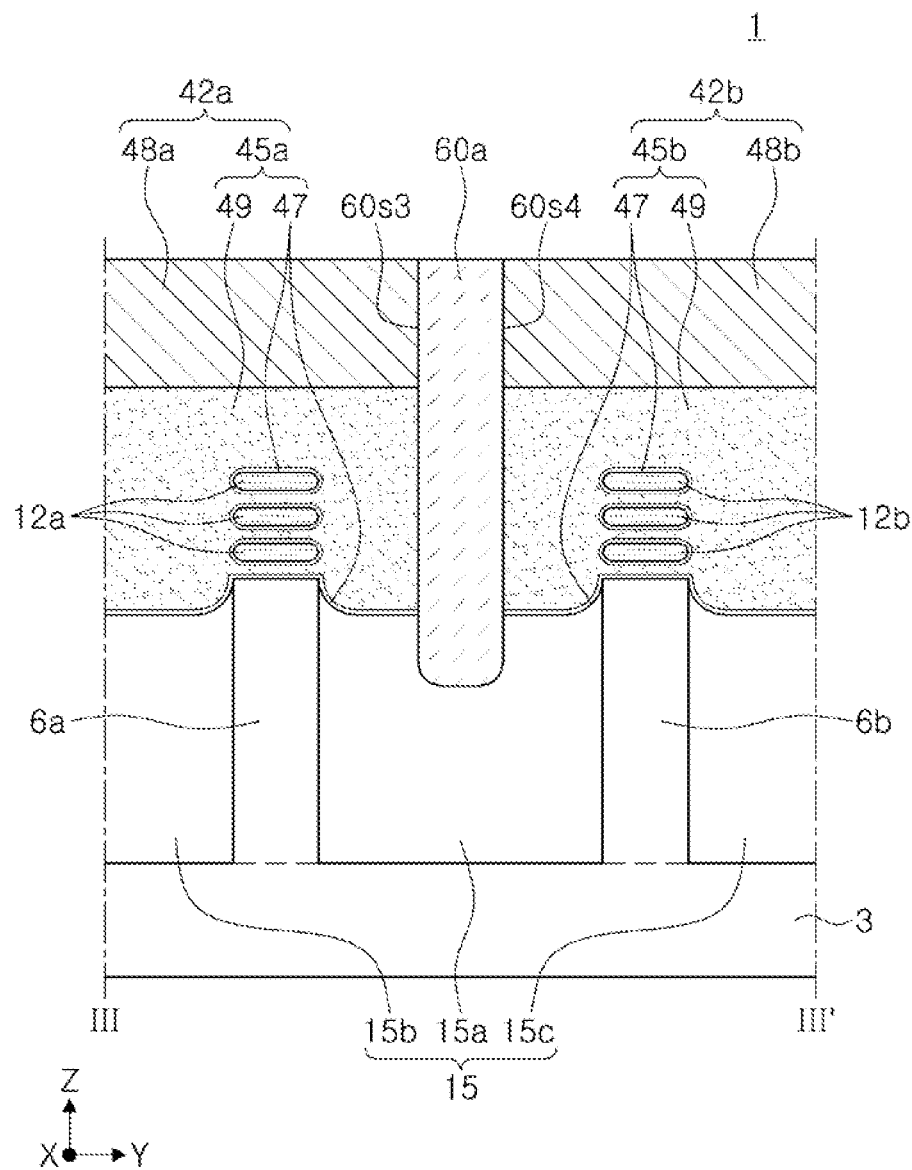
Figure 2D:
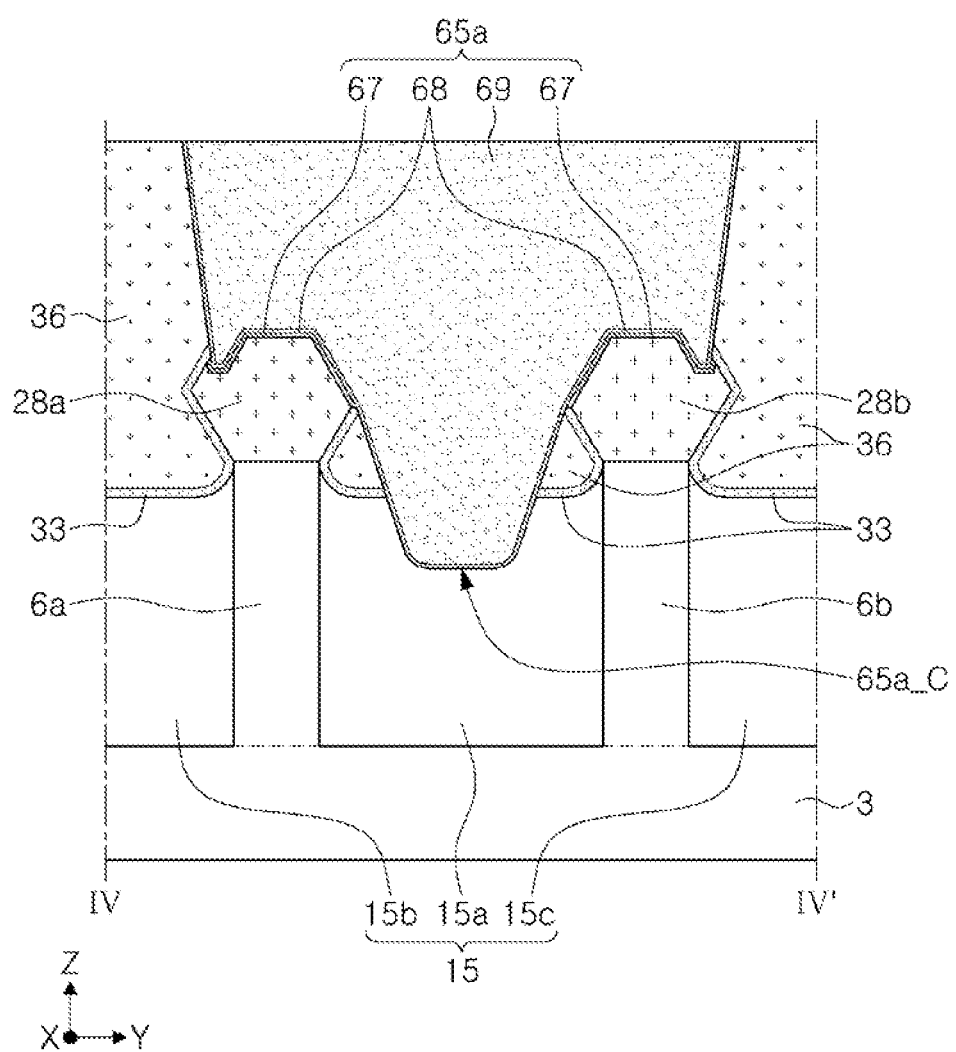
Figure 2E:
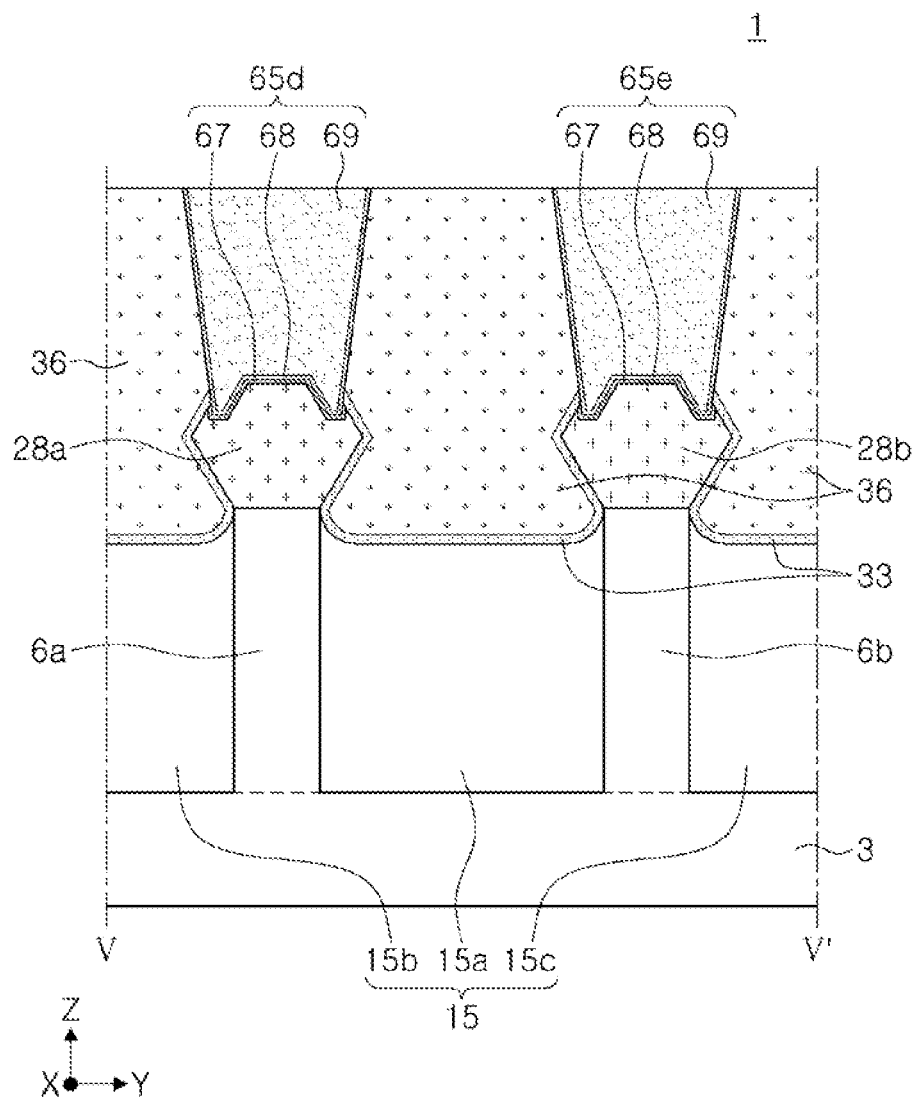

First, an example of a semiconductor device according to an example embodiment will be described with reference to FIG. 1 and FIGS. 2A to 2E. In FIGS. 1 and 2A to 2E, FIG. 1 is a plan view illustrating a semiconductor device according to an example embodiment, FIG. 2A is a cross-sectional view illustrating a region taken along line I-I' of FIG. 1, FIG. 2B is a cross-sectional view taken along the line II-II' of FIG. 1, FIG. 2C is a cross-sectional view taken along the line of FIG. 1, FIG. 2D is a cross-sectional view taken along line IV-IV' of FIG. 1, and FIG. 2E is a cross-sectional view taken along line V-V' of FIG. 1.

Referring to FIGS. 1 and 2A to 2E, a semiconductor device 1 according to an example embodiment may include a substrate 3, active regions 6a and 6b, an isolation layer 15, source/drain regions 28a, 28b, 28c, 28d, 28e and 28f, line structures, contact plugs 65a, 65b, 65c, 65d, and 65e, and interlayer insulating layers 36.

The substrate 3 may include a semiconductor material, for example, a group IV semiconductor, a group III-V compound semiconductor, or a group II-VI compound semiconductor. For example, the group IV semiconductor may include silicon, germanium, or silicon-germanium.

Each of the active regions 6a and 6b may protrude from the substrate 3 in a vertical direction Z perpendicular to the upper surface of the substrate 3. The active regions 6a and 6b may include a first active region 6a and a second active region 6b parallel to and adjacent to each other. Each of the first and second active regions 6a and 6b may have a line shape or a bar shape extending in a first direction (X). The first direction X may be a direction parallel to the upper surface of the substrate 3.

The first active region 6a and the second active region 6b may have different conductivity types. When the first active region 6a has a first conductivity type, the second active region 6b may have a second conductivity type, different from the first conductivity type. The first conductivity type may be an N-type conductivity type, and the second conductivity type may be a P-type conductivity type. In another example, the first conductivity type may be a P-type conductivity type, and the second conductivity type may be an N-type conductivity type. In this case, the 'conductivity type' may mean a conductivity type formed by doping a semiconductor material with impurities, for example, an N-type semiconductor or a P-type semiconductor.

The isolation layer 15 may include a first device isolation layer 15a, a second device isolation layer 15b, and a third device isolation layer 15c. The first device isolation layer 15a may be disposed between the first active region 6a and the second active region 6b. The first active region 6a may be disposed between the first device isolation layer 15a and the second device isolation layer 15b. The second active region 6b may be disposed between the first device isolation layer 15a and the third device isolation layer 15c. At least a portion of the isolation layer 15 may have an upper surface at a lower level than upper surfaces of the first and second active regions 6a and 6b as shown, for example, in FIGS. 2C, 2D, and 2E.

The semiconductor device 1 may further include first channel layers 12a stacked while being spaced apart from each other in the vertical direction Z, on the first active region 6a, and second channel layers 12b stacked while being spaced apart from each other in the vertical direction Z, on the second active region 6b.

The line structures may include a first line structure (42a, 60a, 42b) and a second line structure (42c, 60b, 42d) parallel to and adjacent to each other, and a third line structure 40a and a fourth line structure 40b disposed on either side of the first and second line structures. The line structures may extend in a second direction (Y) perpendicular to the first direction (X).

The first line structure (42a, 60a, 42b) may include a first gate structure 42a overlapping the first active region 6a and extending onto the isolation layer 15, a second gate structure 42b overlapping the second active region 6b and extending onto the isolation layer 15, and a first insulating separation pattern 60a disposed between the first gate structure 42a and the second gate structure 42b and extending into the first device isolation layer 15a. The second line structure (42c, 60b, 42d) may include a third gate structure 42c overlapping the first active region 6a and extending onto the device isolation layer 15, a second gate structure 42d overlapping the second active region 6b and extending onto the isolation layer 15, and a second insulating separation pattern 60b disposed between the third gate structure 42c and the fourth gate structure 42d and extending into the first device isolation layer 15a.

The first gate structure 42a may include a first gate pattern 45a, a first gate spacer 25a1 and a second gate spacer 25a2 disposed on either side of the first gate pattern 45a, and a first insulating capping pattern 48a on the first gate pattern 45a and the first and second gate spacers 25a1 and 25a2.

The second gate structure 42b may include a second gate pattern 45b, a third gate spacer 25b1 and a fourth gate spacer 25b2 disposed on either side of the second gate pattern 45b, and a second insulating capping pattern 48b on the second gate pattern 45b and the third and fourth gate spacers 25b1 and 25b2.

The third gate structure 42c may include a third gate pattern 45c, a fifth gate spacer 25c1 and a sixth gate spacer 25c2 disposed on either side of the third gate pattern 45c, and a third insulating capping pattern 48c on the third gate pattern 45c and the fifth and sixth gate spacers 25c1 and 25c2.

The fourth gate structure 42d may include a fourth gate pattern 45d, a seventh gate spacer 25d1 and an eighth gate spacer 25d2 disposed on either side of the fourth gate pattern 45d, and a fourth insulating capping pattern 48d on the fourth gate pattern 45d and the seventh and eighth gate spacers 25d1 and 25d2.

Each of the third and fourth line structures 40a and 40b may include a fifth gate pattern 45, ninth gate spacers 25 disposed on both sides of the fifth gate pattern 45, and a fifth insulating capping pattern 48 on the fifth gate pattern 45 and the ninth gate spacers 25.

Each of the gate patterns 45a-45d and 45 may include a gate dielectric layer 47 and a gate electrode 49 on the gate dielectric layer 47. The gate dielectric layer 47 may include an oxide, nitride, or high-k dielectric material. The high-k dielectric material may refer to a dielectric material having a higher dielectric constant than that of a silicon oxide layer ($SiO_2$). The high-k dielectric material may be any one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). In some embodiments, the gate dielectric layer 47 may be formed of a multilayer film. A material type of the gate electrode 49 may vary according to transistor regions of the semiconductor device 1. The gate electrode 49 may include a metal nitride such as titanium nitride (TiN), tantalum nitride (TaN), or tungsten nitride (WN), and/or a metallic material such as aluminum (Al), tungsten (W), or molybdenum (Mo), or a semiconductor material such as doped polysilicon. According to example embodiments, the gate electrode 49 may be formed of two or more layers. A material type of the gate electrode 49 may vary according to transistor regions of the semiconductor device 1.

The gate spacers 25a1, 25a2, 25b1, 25b2, 25c1, 25c2, 25d1, 25d2, and 25 may include an insulating material, for example, at least one of SiO, SiN, SiCN, SiOC, SiON, and SiOCN. The insulating capping patterns 48a, 48b, 48c, 48d, and 48 may include silicon nitride or a silicon nitride-based insulating material.

The source/drain regions 28a, 28b, 28c, 28d, 28e, and 28f may include source/drain regions 28a, 28c and 28e disposed on the first active region 6a and having the second conductivity type, and source/drain regions 28b, 28d, and 28f disposed on the second active region 6b and having the first conductivity type.

When viewed in a plan view, the source/drain regions 28a, 28b, 28c, 28d, 28e, and 28f may include a first source/drain region 28a disposed between the first gate pattern 45a and the third gate pattern 45c, a second source/drain region 28b disposed between the second gate pattern 45b and the fourth gate pattern 45d, a third source/drain region 28c disposed between the first line structure 40a and the first gate pattern 45a, a fourth source/drain region 28d disposed between the first line structure 40a and the second gate pattern 45b, a fifth source/drain region 28e disposed between the second line structure 40b and the third gate pattern 45c, and a sixth source/drain region 28f disposed between the second line structure 40b and the fourth gate pattern 45d.

In the semiconductor device 1, an area in which the first active region 6a, the first, third and fifth source/drain regions 28a, 28c and 28e having the second conductivity type, and the first and third gate structures 42a and 42c are placed may be defined as a first transistor region TR1, and an area in which the second active region 6b, the second, fourth and sixth source/drain regions 28b, 28d and 28f having the first conductivity type, and the second and fourth gate structures 42b and 42d are disposed may be defined as a second transistor region TR2 as shown, e.g., in FIG. 1. One of the first and second transistor regions TR1 and TR2 may be an NMOS transistor region, and the other may be a PMOS transistor region.

In the first transistor region TR1, each of the first and third gate patterns 45a and 45c may extend in the second direction Y while surrounding the first channel layers 12a on the first active region 6a. In the second transistor region TR2, each of the second and fourth gate patterns 45b and 45d may extend in the second direction Y while surrounding the second channel layers 12b on the second active region 6b. The first and second transistor regions TR1 and TR2 may include a multi-bridge channel FET (MBCFET™) transistor that is a gate-all-around type field effect transistor.

Although the number of the first channel layers 12a stacked while being spaced apart from each other in the vertical direction Z is illustrated as three in the drawings, embodiments are not limited thereto, and the number may be four or more.

Although the number of the second channel layers 12b stacked while being spaced apart from each other in the vertical direction Z is illustrated as three in the drawings, embodiments are not limited thereto, and the number may be four or more.

The interlayer insulating layers 36 may be disposed between the line structures. For example, the interlayer insulating layers 36 may be disposed between the first line structures 42a, 60a, and 42b and the second line structures 42c, 60b, and 42d, and between the first line structures 42a, 60a, and 42b and the third line structure 40a, and between the second line structures 42c, 60b, and 42d and the fourth line structure 40b.

The contact plugs 65a, 65b, 65c, 65d and 65e may pass through the interlayer insulating layers 36. The contact plugs 65a, 65b, 65c, 65d, and 65e may include a common contact plug 65a disposed on the first and second source/drain regions 28a and 28b and the first device isolation layer 15a and in contact with the first and second source/drain regions 28a and 28b, a first contact plug 65b on the third source/drain region 28c and in contact with the third source/drain region 28c, a second contact plug 65c on the fourth source/drain region 28d and in contact with the fourth source/drain region 28d, a third contact plug 65d on the fifth source/drain region 28e and in contact with the fifth source/drain region 28e, and a fourth contact plug 65d disposed on the sixth source/drain region 28f and in contact with the sixth source/drain region 28f.

The common contact plug 65a may include a portion extending into the isolation layer 15. A lowermost end of the common contact plug 65a may be disposed on a level lower than an upper surface of each of the first and second active regions 6a and 6b.

Each of the contact plugs 65a, 65b, 65c, 65d and 65e may include a plug layer 69, a barrier layer 68 covering side surfaces and a bottom surface of the plug layer 69, and a metal-semiconductor compound layer 67 between the barrier layer 68 and the source/drain regions 28a, 28b, 28c, 28d, 28e, and 28f. In some embodiments, in each of the contact plugs 65a, 65b, 65c, 65d and 65e, the plug layer 69 and the metal-semiconductor compound layer 67 may directly contact each other. The plug layer 69 may include a metal material such as tungsten or molybdenum, and the barrier layer 68 may include a metal nitride such as titanium nitride (TiN), tantalum nitride (TaN), or tungsten nitride (WN). The metal-semiconductor compound layer 37 may include, for example, metal silicide, metal germanide, or metal silicide-germanide. In the metal-semiconductor compound layer 37, the metal may be titanium (Ti), nickel (Ni), tantalum (Ta), cobalt (Co), or tungsten (W), and the semiconductor may be silicon (Si), germanium (Ge) or silicon germanium (SiGe). For example, the metal-semiconductor compound layer 37 may include at least one of cobalt silicide (CoSi), titanium silicide (TiSi), nickel silicide (NiSi), and tungsten silicide (WSi).

The semiconductor device 1 may further include an insulating liner 33 covering a lower surface of the interlayer insulating layers 36 as shown, e.g., in FIGS. 2D and 2E. The interlayer insulating layers 36 may be formed of silicon oxide or a low dielectric material, and the insulating liner 33 may be formed of a material different from that of the interlayer insulating layers 36, for example, formed of a silicon nitride or silicon nitride-based insulating material. The insulating liner 33 is disposed between the isolation layer 15 and the interlayer insulating layers 36 and may extend to surfaces of the source/drain regions that do not contact the contact plugs. In addition, the insulating liner 33 may extend onto side surfaces of the line structures.

The first and second insulating separation patterns 60a and 60b will be described again. The first and second insulating separation patterns 60a and 60b may be formed to have the same shape and structure as each other. Accordingly, the description will be focused on the first insulating separation pattern 60a.

At least a portion of the first insulating separation pattern 60a may be disposed between the common contact plug 65a and the interlayer insulating layer 36. In this case, the interlayer insulating layer 36 may be an interlayer insulating layer positioned between the first line structures 42a, 60a, and 42b and the third line structures 40a.

The first insulating separation pattern 60a may have a first side surface 60s1 and a second side surface 60s2 opposing each other, and a third side surface 60s3 and a fourth side surface 60s4 opposing each other. The first side surface 60s1 and the second side surface 60s2 may be sequentially disposed in the first direction X, and the third side surface 60s3 and the fourth side surface 60s4 may be sequentially disposed in the second direction Y.

At least one of the first and second side surfaces 60s1 and 60s2 and at least one of the third and fourth side surfaces 60s3 and 60s4 may have different side profiles. For example, at least one of the third and fourth side surfaces 60s3 and 60s4 may have a substantially vertical side surface.

At least one of the first and second side surfaces 60s1 and 60s2 may include a first portion 60s1a, 60s2a, a second portion 60s1b, 60s2b at a lower level than the first portion 60s1a, 60s1b, and a third portion 60s1c, 60s2c having a lower level than the second portion 60s1b and 60s2b. For example, the first side surface 60s1 may include a first portion 60s1a, a second portion 60s1b, and a third portion 60s1c. In the first side surface 60s1, the first and third portions 60s1a and 60s1c may each have a steeper slope than that of the second portion 60s1b. In the first side surface 60s1, the third portion 60s1c may be disposed in the first device isolation layer 15a, the second portion 60s1b may extend from the third portion 60s1c and may have a gentler slope than the third portion 60s1c, and the first portion 60s1a may extend from the second portion 60s1b and have a steeper slope than the second portion 60s1b. See, e.g., FIG. 2B.

In the first side surface 60s1, the third portion 60s1c may be in contact with the first device isolation layer 15a, the second portion 60s1b may be bent and extended from the third portion 60s1c in a direction away from the central axis of the first insulating separation pattern 60a, and the first portion 60s1a may be bent and extended from the second portion 60s1b.

In the first direction (X), the first insulating separation pattern 60a may have a first width portion having a substantially constant first width, a second width portion disposed below the first width portion and having a width that is less than the first width and decreases in width, and a third width portion disposed below the second width portion and having a width less than that of the second width portion. In addition, in the first side surface 60s1, the first portion 60s1a may be a side surface of the first width portion, the second portion 60s1b may be a side surface of the second width portion, and the third portion 60s1c may be a side surface of the third width portion.

The first line structure (42a, 60a, 42b) may further include a connection spacer 25ib extending from the first gate spacer 25a1 and the third gate spacer 25b1, and a connection spacer 25ia extending from the second gate spacer 25a2 and the fourth gate spacer 25b2 (see, e.g., FIG. 2B).

Upper ends of the connection spacers 25ia and 25ib may be disposed on a level lower than upper surfaces of the first and second gate spacers 25a1 and 25a2. Upper ends of the connection spacers 25ia and 25ib may contact the first and second side surfaces 60s1 and 60s2 of the first insulating separation pattern 60a. For example, upper ends of the connection spacers 25ia and 25ib may be in contact with the second portions 60s1b and 60s2b of the first and second side surfaces 60s1 and 60s2 of the first insulating separation pattern 60a.

Next, various modifications of the semiconductor device 1 according to an example embodiment described above will be described. Hereinafter, in describing various modified examples of the above-described semiconductor device 1, the components that are deformed or replaced among the components of the above-described semiconductor device 1 will be mainly described, and a description of the components substantially the same as those of the above description or a description of the components that may be easily understood from the descriptions or drawings described above will be omitted.

First, various modifications of the semiconductor device 1 according to an example embodiment described above will be described with reference to FIGS. 3 to 7C, respectively. FIGS. 3 to 7C are cross-sectional views illustrating various modified examples of the semiconductor device 1 according to an example embodiment described above.

Figure 3:
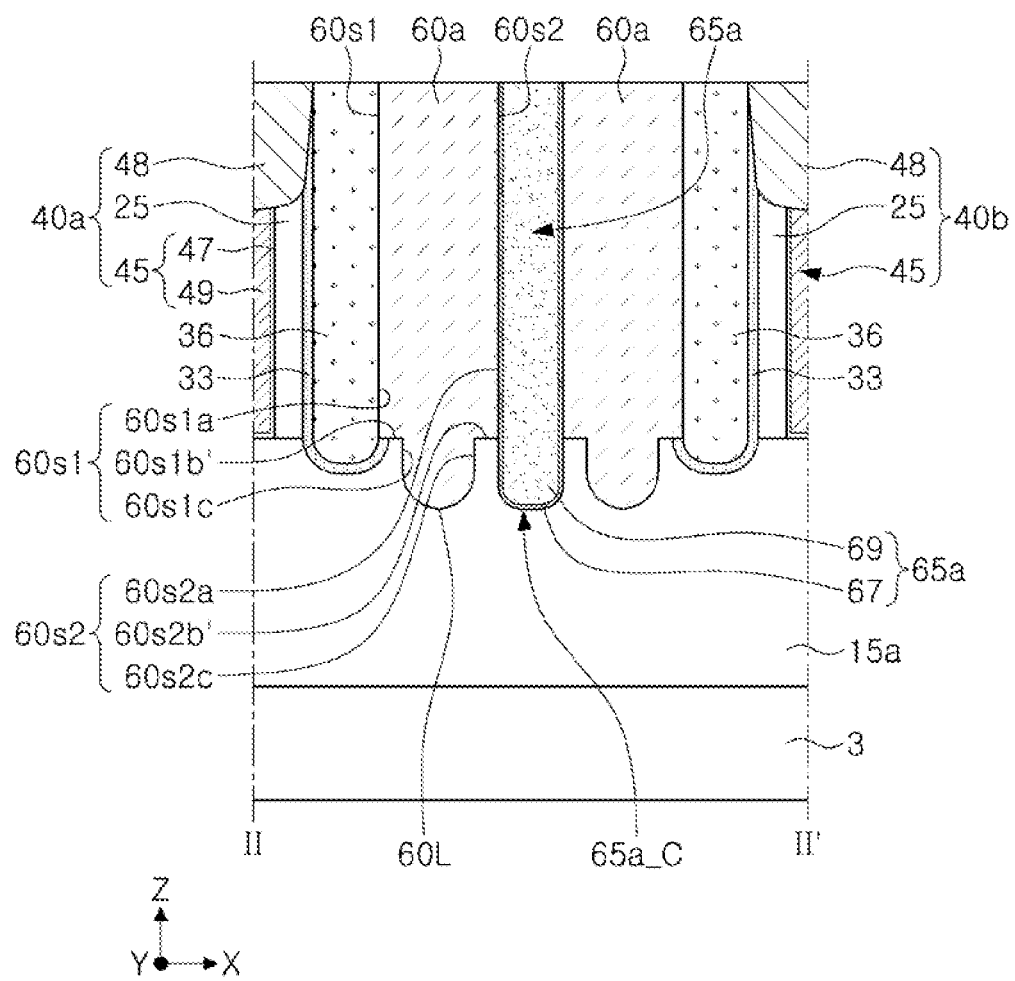
FIG. 3 is a cross-sectional view illustrating a modified example of a semiconductor device according to an example embodiment.

In a modified example, referring to FIG. 3, the connection spacers (25*ia* and 25*ib* in FIG. 2B) are omitted, and the first and second gate spacers 25*a*1 and 25*a*2 may be spaced apart from the third and fourth gate spacers 25*b*1 and 25*b*2. In at least one of the first and second side surfaces 60*s*1 and 60*s*2 described above, the second portions 60*s*1*b* and 60*s*2*b* (see FIG. 2B) may be replaced by second portions 60*s*1*b*' and 60*s*2*b*' to be in contact with the first device isolation layer 15*a*, and accordingly, may have a step-like structure in a region in contact with the first device isolation layer 15*a* in the first insulating separation pattern 60*a*.

Figure 4:
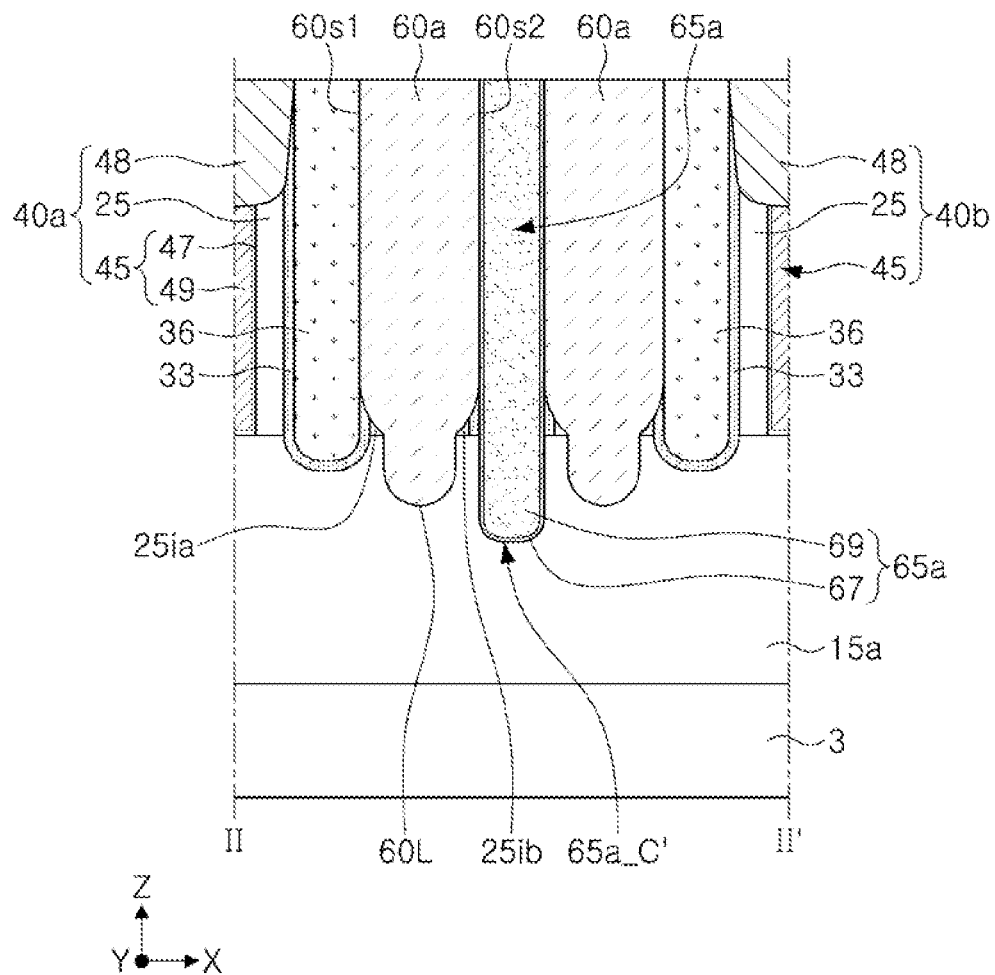
FIG. 4 is a cross-sectional view illustrating a modified example of a semiconductor device according to an example embodiment.

In a modified example, referring to FIG. 4, a lower end 65*a*_C' of the common contact plug 65*a* positioned between the first and second insulating separation patterns 60*a* and 60*b* may be positioned on a level lower than a lower end of each of the first and second insulating separation patterns 60*a* and 60*b*.

Figure 5A:
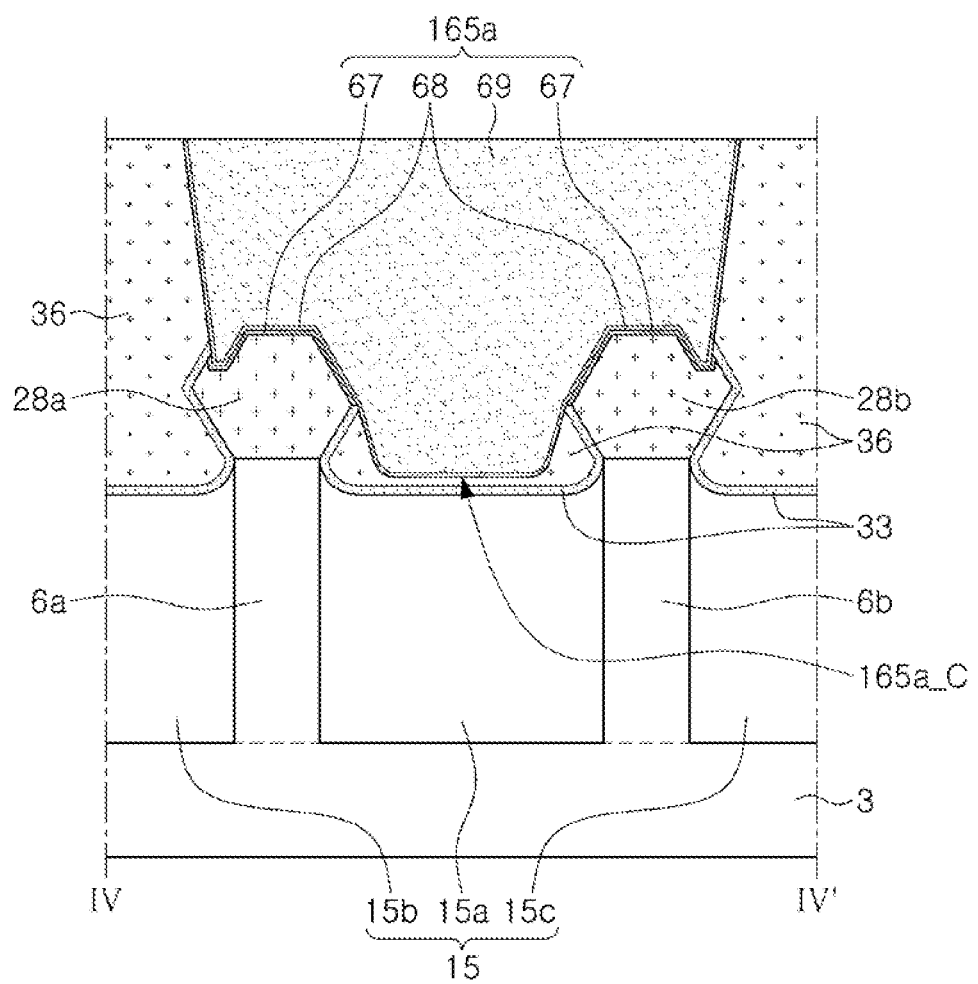
FIGS. 5A and 5B are views illustrating a modified example of a semiconductor device according to an example embodiment.
Figure 5B:
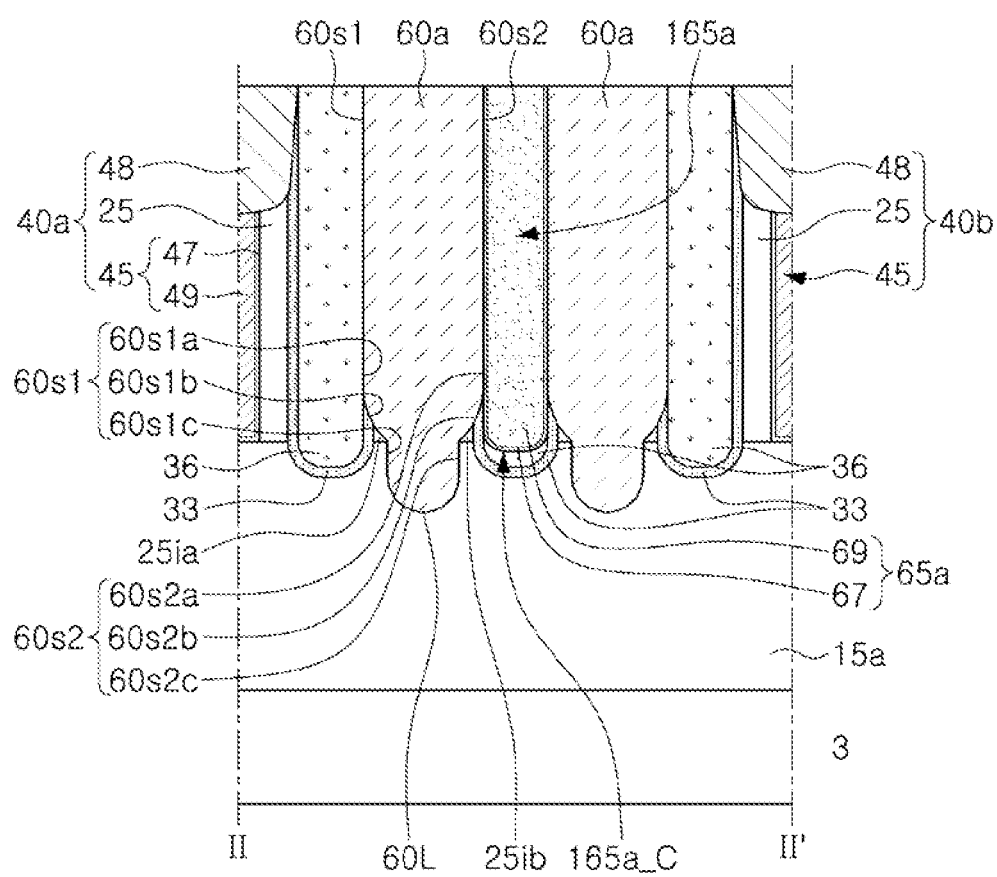

In a modified example, referring to FIGS. 5A and 5B, the common contact plug 65*a* may be replaced with a common contact plug 165*a* having a lower surface 165*a*_C disposed at a higher level than an upper surface of the first device isolation layer 15*a*. The lower surface 165*a*_C of the common contact plug 165*a* may be disposed on a level lower than the upper surface of the first and second active regions 6*a* and 6*b*. The insulating liner 33 and the interlayer insulating layer 36 may be disposed between the lower surface 165*a*_C of the common contact plug 165*a* and the first device isolation layer 15*a*.

Figure 6A:
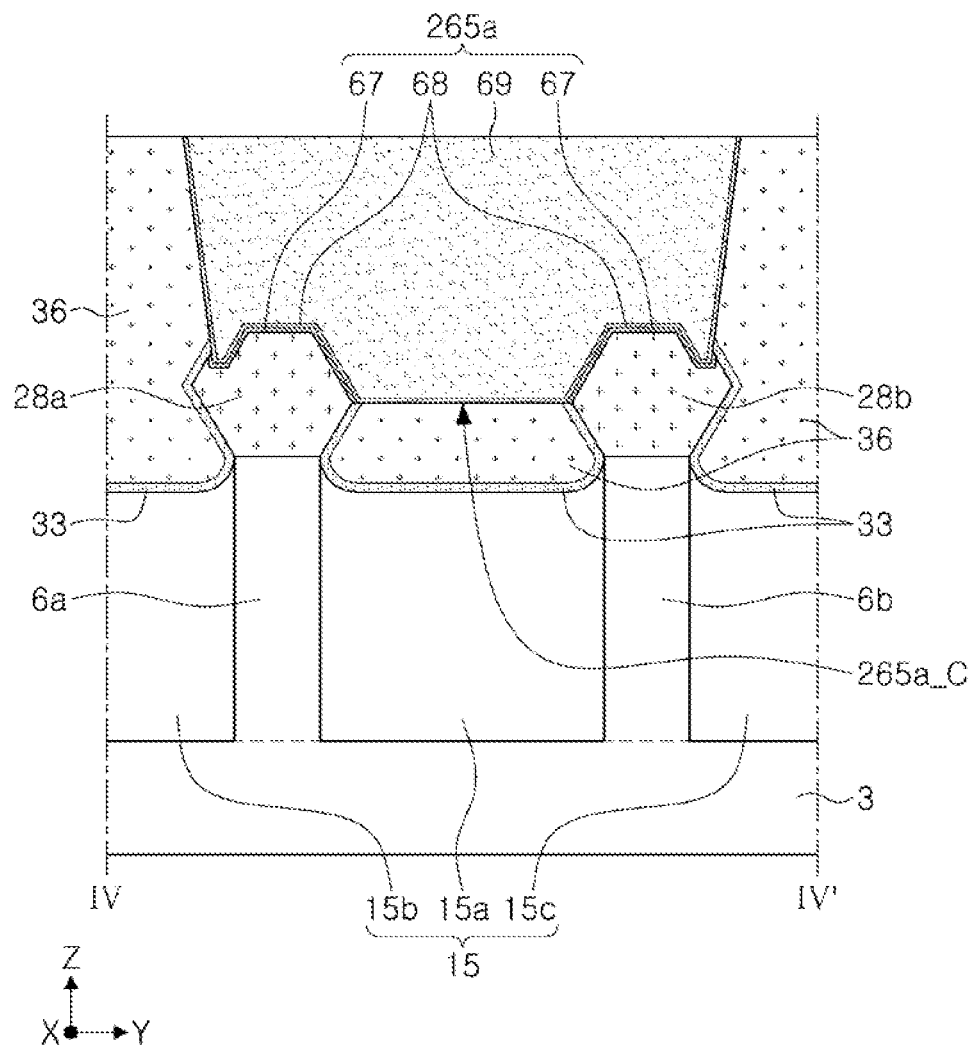
FIGS. 6A and 6B are views illustrating a modified example of a semiconductor device according to an example embodiment.
Figure 6B:
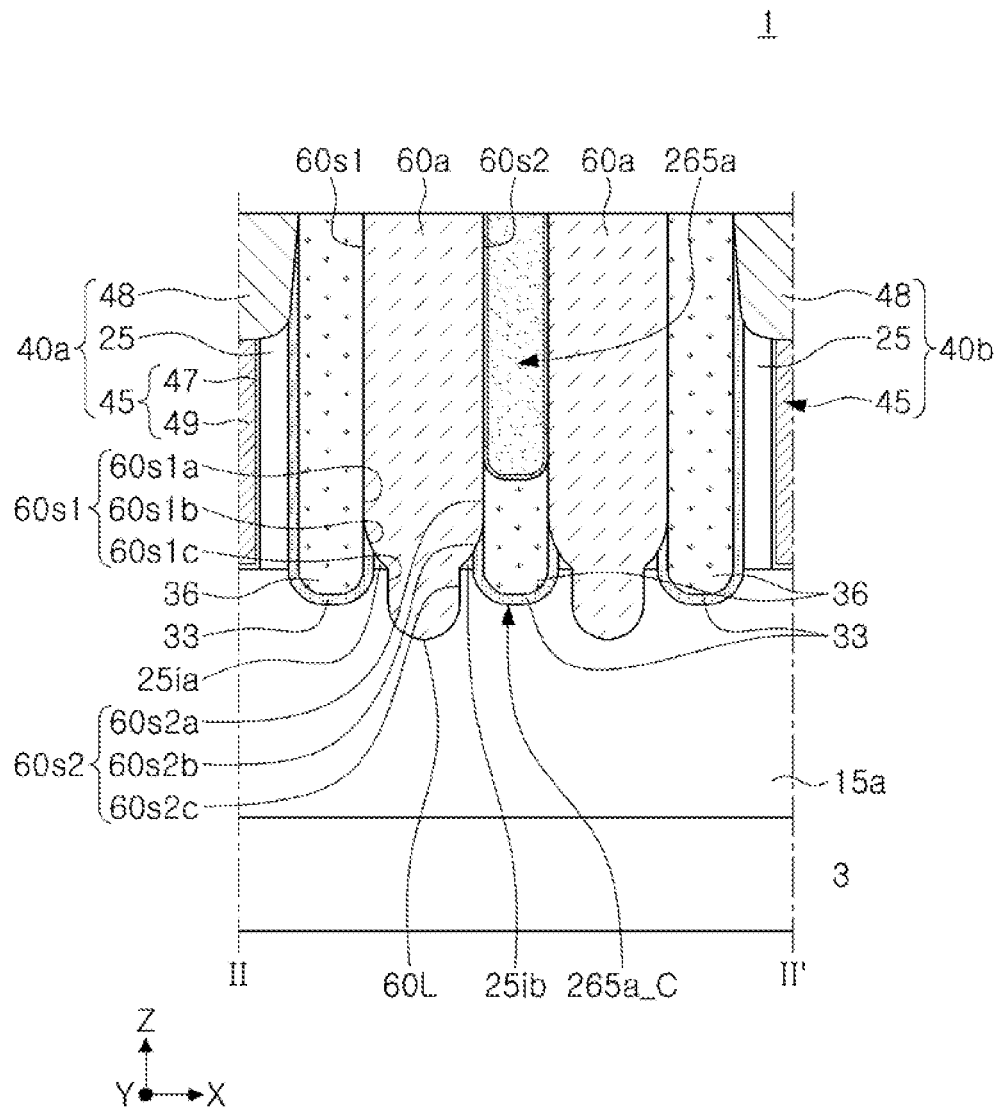

In a modified example, referring to FIGS. 6A and 6B, the common contact plug 65*a* may be replaced with the common contact plug 265*a* having a lower surface 265*a*_C that is disposed on a level higher than the upper surface of the first device isolation layer 15*a* and upper surfaces of the first and second active regions 6*a* and 6*b*.

Figure 7A:
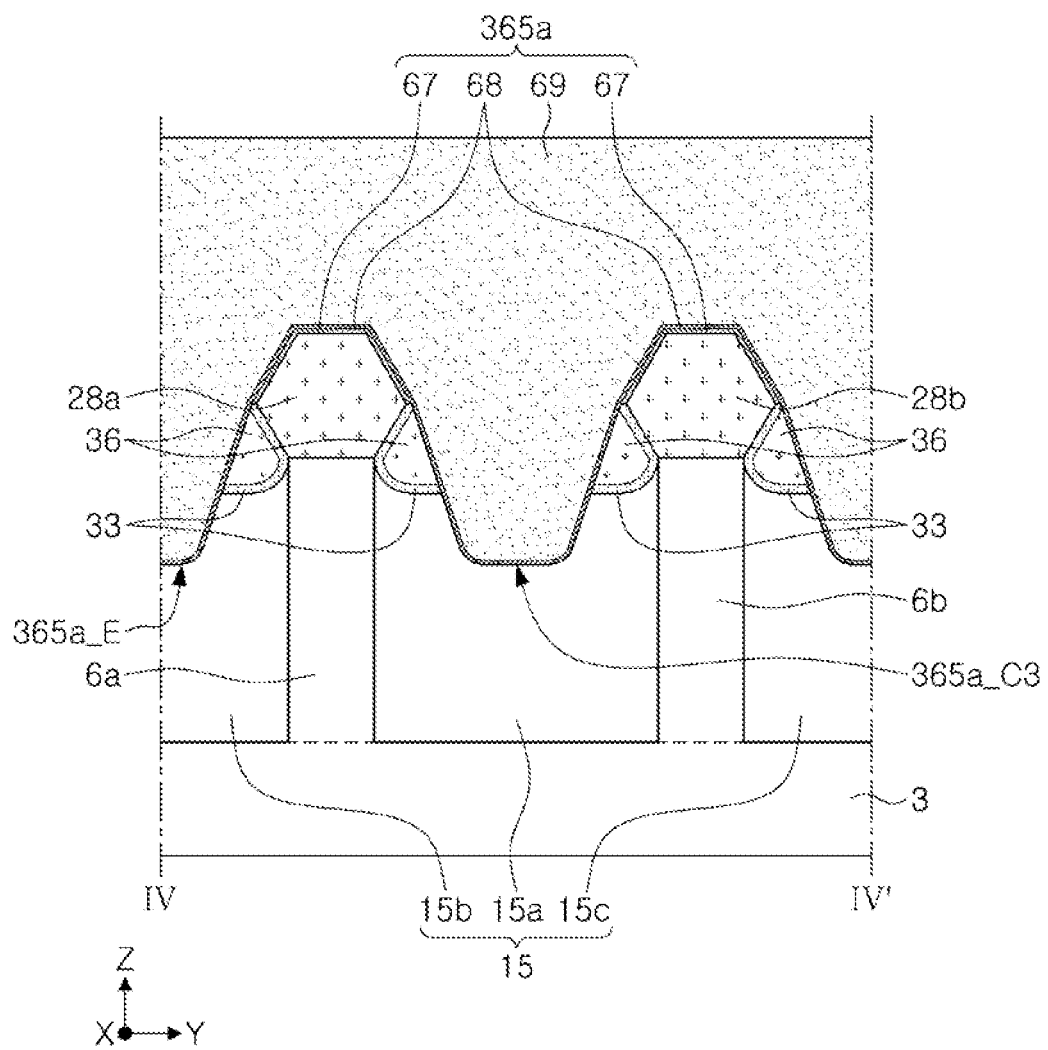
FIG. 7A is a cross-sectional view illustrating a modified example of a semiconductor device according to an example embodiment.

In a modified example, referring to FIG. 7A, in the second direction Y, the common contact plug (see 65*a* of FIG. 2D) in FIG. 2D may be replaced with a common contact plug 365*a* extending from a portion covering the first source/drain region 28*a* in a direction away from the second source/drain region 28*b* and extending from a portion covering the second source/drain region 28*b* in a direction away from the first source/drain region 28*a*. In the second direction Y, the common contact plug 365*a* may include an end portion extending into the second device isolation layer 15*b* and an end portion extending into the third device isolation layer 15*c*.

In the second direction Y, lower ends 365*a*_E of both end portions of the common contact plug 365*a* and a lower end 365*a*_C3 of an intermediate portion of the common contact plug 365*a* may be disposed in the isolation layer 15.

Figure 7B:
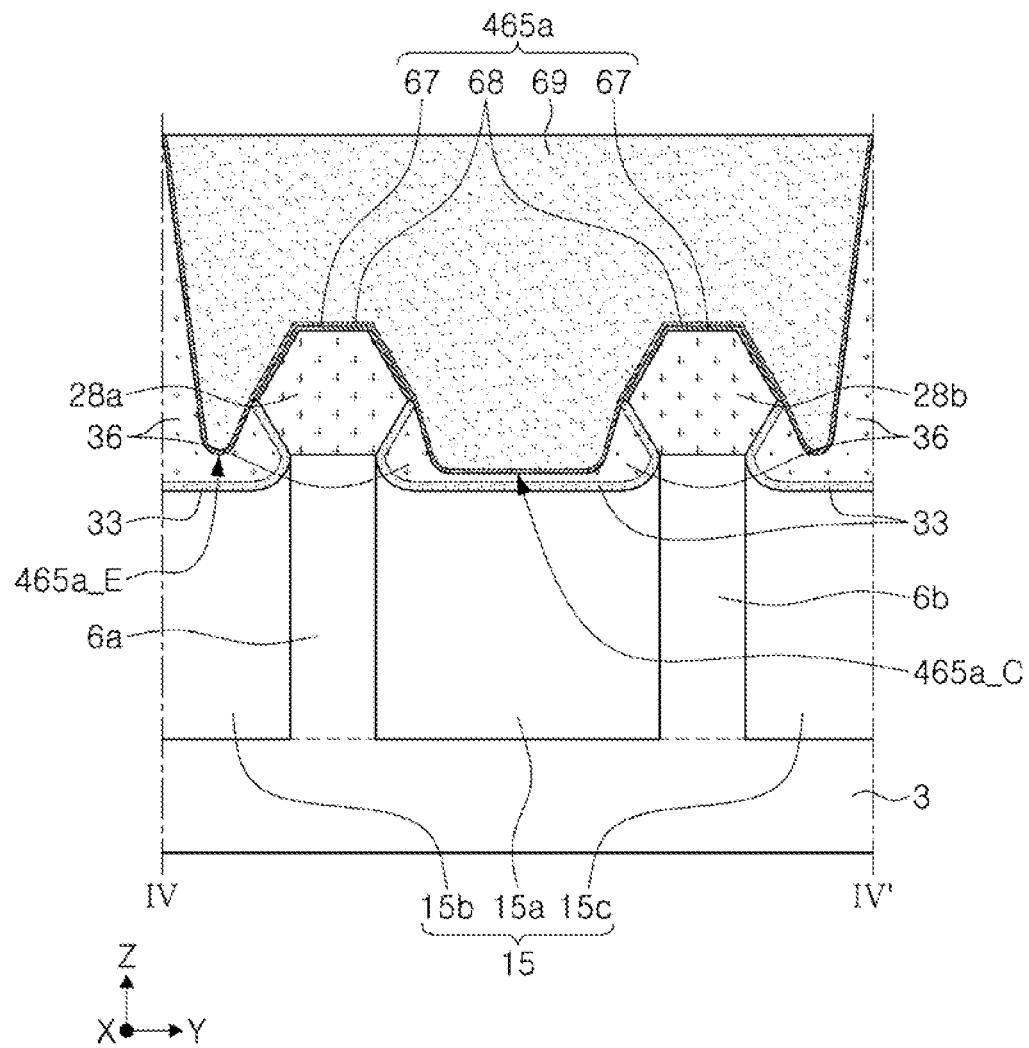
FIG. 7B is a cross-sectional view illustrating a modified example of a semiconductor device according to an example embodiment.

In a modified example, referring to FIG. 7B, in the second direction Y, the common contact plug (165*a* of FIG. 5A) in FIG. 5A may be replaced with a common contact plug 465*a* extending from a portion covering the first source/drain region 28*a* in a direction away from the second source/drain region 28*b* and extending from a portion covering the second source/drain region 28*b* in a direction away from the first source/drain region 28*a*. In the second direction Y, the common contact plug 465*a* may include an end portion overlapping the second device isolation layer 15*b* and an end portion overlapping the third device isolation layer 15*c* when viewed in the direction Z.

In the second direction Y, lower ends 465*a*_E of both end portions of the common contact plug 465*a* and a lower end 465*a*_C3 of an intermediate portion of the common contact plug 465*a* may be spaced apart from the isolation layer 15, and may be disposed on a level lower than the upper surfaces of the first and second active regions 6*a* and 6*b*.

Figure 7C:
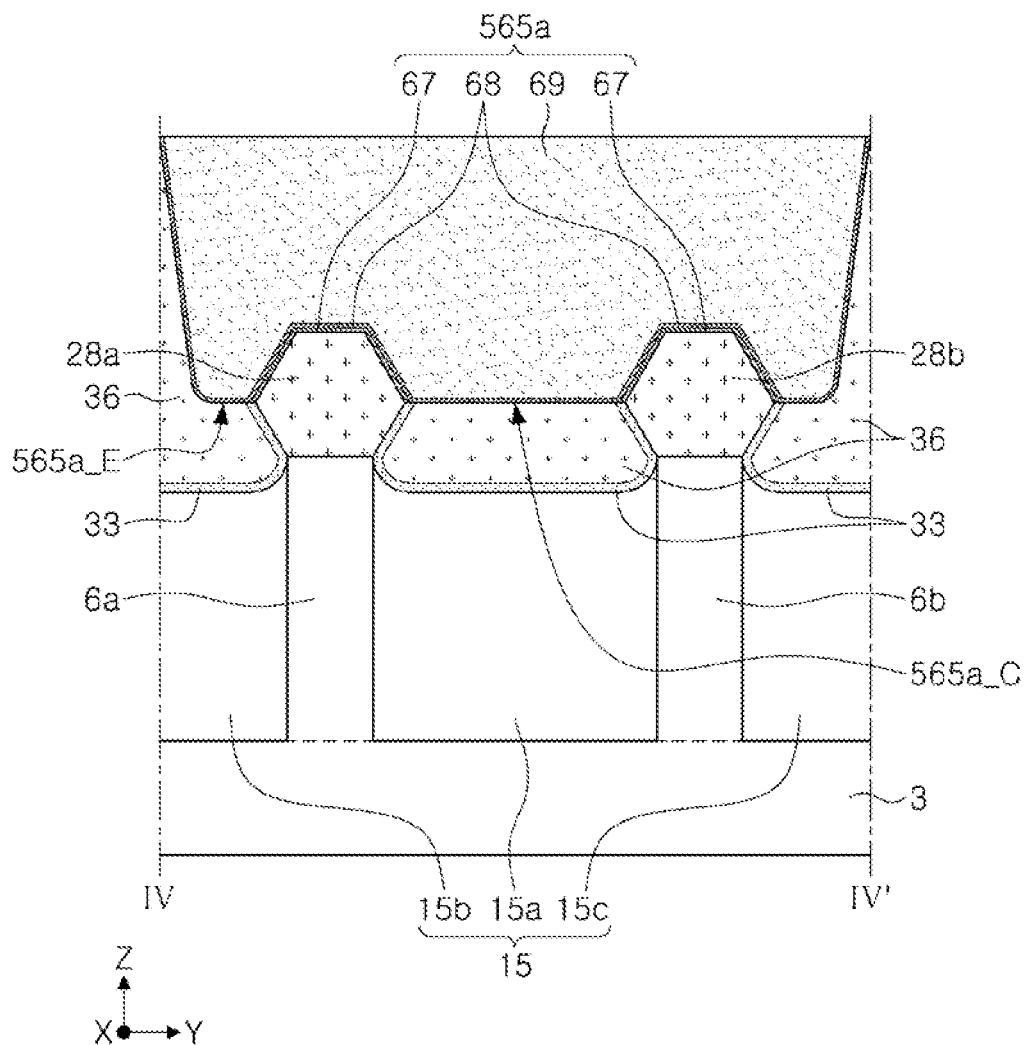
FIG. 7C is a cross-sectional view illustrating a modified example of a semiconductor device according to an example embodiment.

In a modified example, referring to FIG. 7C, in the second direction Y, the common contact plug (265*a* of FIG. 6A) in FIG. 6A may be replaced with a common contact plug 565*a* extending from a portion covering the first source/drain region 28*a* in a direction away from the second source/drain region 28*b* and extending from a portion covering the second source/drain region 28*b* in a direction away from the first source/drain region 28*a*. In the second direction Y, the common contact plug 565*a* may include an end portion overlapping the second device isolation layer 15*b* and an end portion overlapping the third device isolation layer 15*c* when viewed in the direction Z.

In the second direction Y, lower ends 565*a*_E of both end portions of the common contact plug 565*a* and a lower end 565*a*_C3 of an intermediate portion of the common contact plug 565*a* may be spaced apart from the isolation layer 15, and may be disposed on a level higher than the upper surfaces of the first and second active regions 6*a* and 6*b*.

Next, in the semiconductor device 1 according to an example embodiment described above with reference to FIGS. 8A to 8C, various examples of planar shape of the first and second insulating separation patterns 60*a* and 60*b* and the common contact plug 65*a* will be described.

Figure 8A:
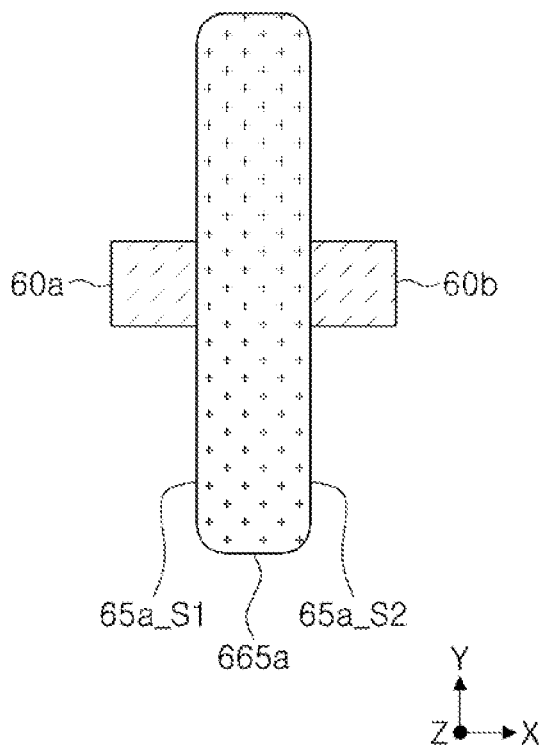
FIG. 8A is a plan view illustrating a modified example of a semiconductor device according to an example embodiment.

Referring to FIG. 8A, the common contact plug 665*a* may have a bar or line shape extending in the second direction Y, and may have side surfaces 65*a*_S1 and 65*a*_S2 opposing each other along a longitudinal length of the common contact plug 665*a* in the second direction Y. The side surfaces 65*a*_S1 and 65*a*_S2 may have a straight shape extending in the second direction Y.

Figure 8B:
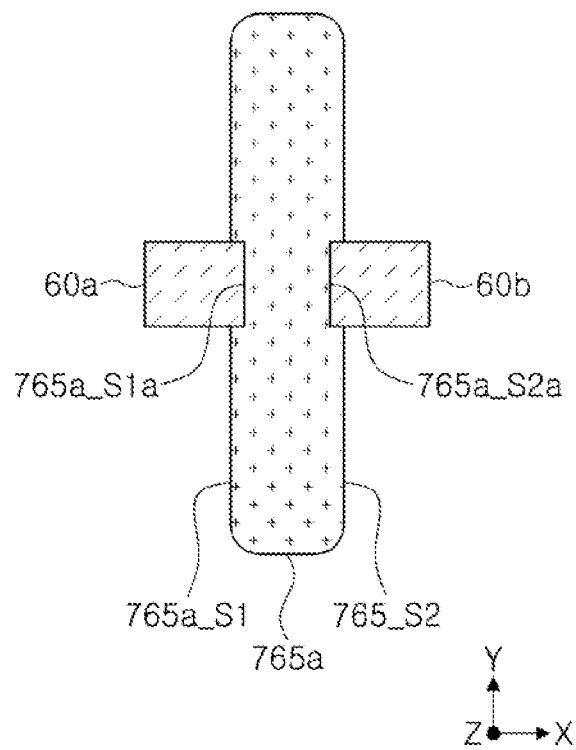
FIG. 8B is a plan view illustrating a modified example of a semiconductor device according to an example embodiment.

In a modified example, referring to FIG. 8B, the common contact plug 765*a* may have a bar or line shape extending in the second direction Y, and may have side surfaces 765*a*_S1 and 765*a*_S2 opposing each other in the longitudinal direction. The side surfaces 765*a*_S1 and 765*a*_S2 may have recess regions 765*a*_S1*a* and 765*a*_S2*a* having a concave shape between the first and second insulating separation patterns 60*a* and 60*b*. Accordingly, the common contact plug 765*a* may have a smaller width between the first and second insulating separation patterns 60*a* and 60*b* than at other portions of the common contact plug 765*a*.

Figure 8C:
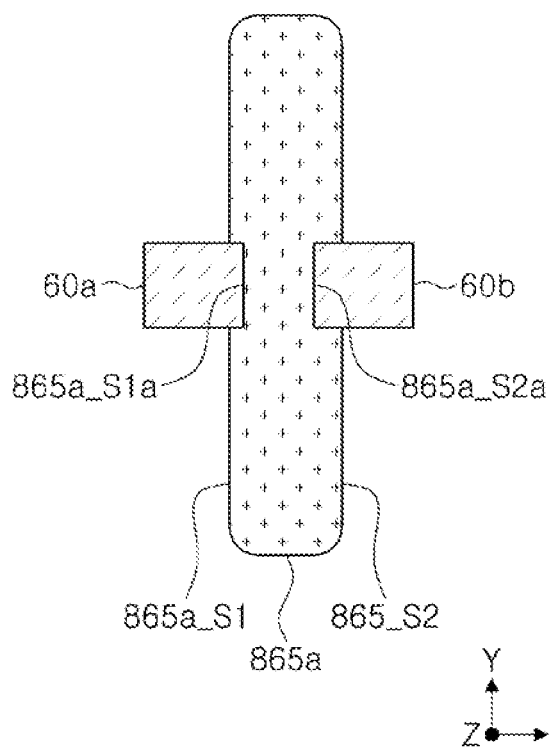
FIG. 8C is a plan view illustrating a modified example of a semiconductor device according to an example embodiment.

In a modified example, referring to FIG. 8C, the common contact plug 865*a* may have a bar or line shape extending in the second direction Y, and may have side surfaces 865*a*_S1 and 865*a*_S2 opposing each other in the longitudinal direction. The side surfaces 865*a*_S1 and 865*a*_S2 may have recess regions 865*a*_S1*a* and 865*a*_S2*a* having a concave shape between the first and second insulating separation patterns 60*a* and 60*b*, and may have an asymmetric structure.

Next, a modified example of the common contact plug in the semiconductor device 1 according to an example embodiment described above will be described with reference to FIG. 9.

Figure 9:
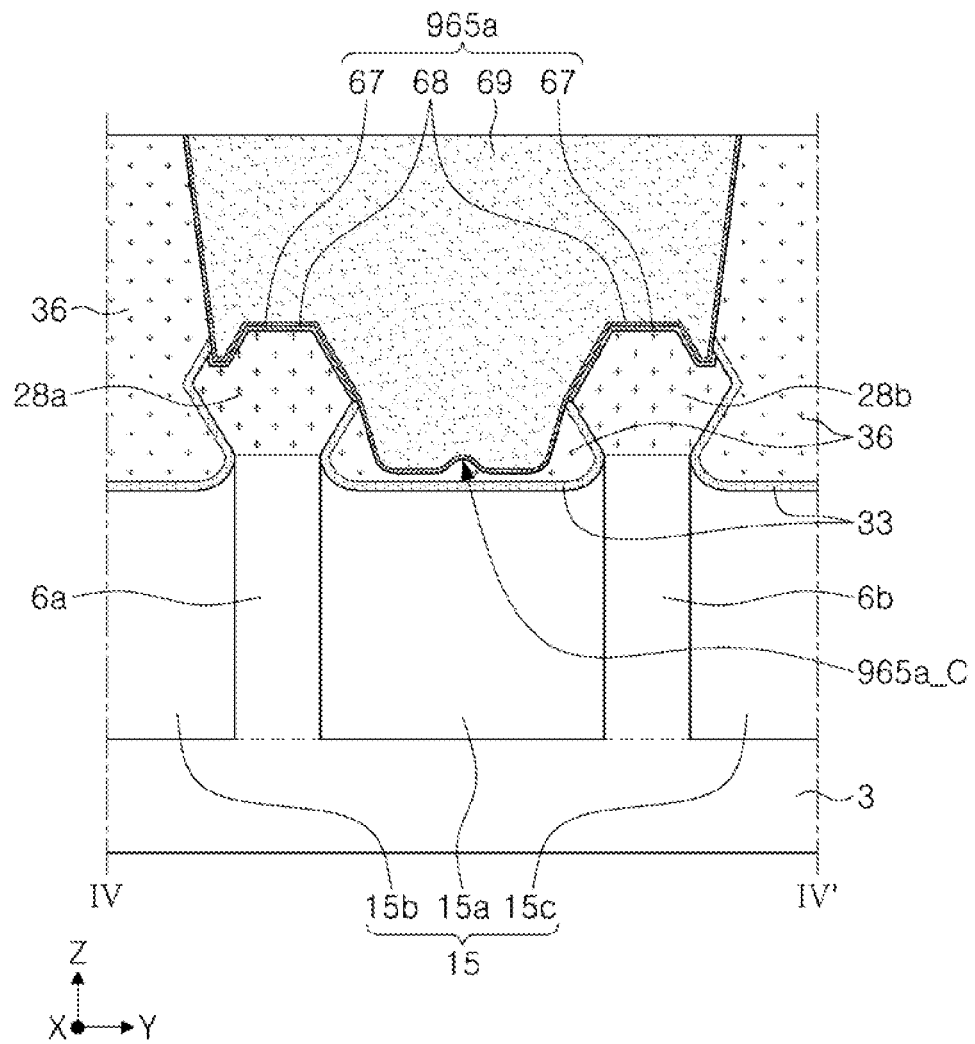
FIG. 9 is a cross-sectional view illustrating a modified example of a semiconductor device according to an example embodiment.

In a modified example, referring to FIG. 9, an intermediate region of the lower surface 965*a*_C of the common contact plug 965a positioned between the first and second active regions 6a and 6b or between the first source/drain regions 28a and 28b may have a convex shape protruding away from the substrate 3 in a vertical direction Z. For example, the common contact plug 965a may have a lower surface having a recessed area. The shape of the lower surface 965a_C may be applied to all of the contact plugs described above.

Next, referring to FIGS. 10 to 19D, an illustrative example of a method of forming a semiconductor device according to an example embodiment will be described. FIGS. 10 to 19D are diagrams illustrating an example of a method of forming a semiconductor device according to an example embodiment. In FIGS. 10 to 19D, FIGS. 10, 14, 16 and 18 are plan views sequentially illustrating a method of forming a semiconductor device according to an example embodiment, FIGS. 11A, 12A, 13A, 15A, 17A, and 19A are cross-sectional views illustrating regions taken along line I-I' of FIGS. 1, 10, 14, 16 and 18, FIGS. 11B, 12B, 13B, 15B, 17B and 19B are cross-sectional views illustrating regions taken along line II-II' of FIGS. 1, 10, 14, 16 and 18, FIGS. 11C, 13C, 15C and 19C are cross-sectional views illustrating regions taken along line of FIGS. 1, 10, 14, 16 and 18, and FIGS. 11D, 12B, 13D, 17C and 19D are cross-sectional views illustrating regions taken along line IV-IV' of FIGS. 1, 10, 14, 16 and 18.

Referring to FIGS. 10, 11A, 11B, 11C, and 11D, first active structures 6a, 9a, 12a and second active structures 6b, 9b, and 12b may be formed on a substrate 3.

The first active structures 6a, 9a, and 12a may include a first active region 6a. First sacrificial layers 9a and first channel layers 12a may be alternately stacked on the first active region 6a. The second active structures 6b, 9b, and 12b may include a second active region 6b. Second sacrificial layers 9b and second channel layers 12b may be alternately stacked on the second active region 6b.

Forming the first active structures 6a, 9a, 12a and the second active structures 6b, 9b and 12b may include forming sacrificial layers and channel layers alternately stacked on a semiconductor substrate, and etching the alternately stacked sacrificial layers and channel layers, and the semiconductor substrate to form a trench defining the first active structures 6a, 9a and 12a and the second active structures 6b, 9b, and 12b.

The substrate 3 may be formed by etching the semiconductor substrate. The substrate 3 may be formed of a semiconductor material, for example, silicon or a compound semiconductor. The first and second active regions 6a and 6b may have a shape protruding from the substrate 3 in the vertical direction Z, and may be formed of the same semiconductor material as the substrate 3.

The sacrificial layers 9a and 9b and the channel layers 12a and 12b may be formed of semiconductor materials by an epitaxial growth process. The sacrificial layers 9a and 9b may be formed of a material having etch selectivity with respect to the channel layers 12a and 12b. The channel layers 12a and 12b may be formed of a first semiconductor material, for example, silicon, and the sacrificial layers 9a and 9b may be formed of a second semiconductor material different from the first semiconductor material, for example, formed of at least one material among silicon germanium (SiGe) and germanium (Ge). The first semiconductor material is not limited to silicon, and may be formed of a compound semiconductor different from the second semiconductor material, for example, silicon carbide.

The first active region 6a and the second active region 6b may have different conductivity types. The first channel layers 12a may have a conductivity type different from that of the second channel layers 12b. The first active region 6a and the first channel layers 12a may have the same conductivity type, and the second active region 6b and the second channel layers 12b may have the same conductivity type. When the first active region 6a and the first channel layers 12a have a first conductivity type, the second active region 6b and the second channel layers 12b may have a second conductivity type different form the first conductivity type. The first conductivity type may be an N-type conductivity type, and the second conductivity type may be a P-type conductivity type. In another example, the first conductivity type may be a P-type conductivity type, and the second conductivity type may be an N-type conductivity type.

The number of layers of the channel layers 12a and 12b alternately stacked with the sacrificial layers 9a and 9b may be variously changed in some embodiments. For example, the channel layers 12a and 12b are illustrated as three layers in the drawings, but may also be formed of four or more layers according to example embodiments.

An isolation layer 15 may be formed to cover side surfaces of some of the first active structures 6a, 9a, and 12a and the second active structures 6b, 9b, and 12b, on the substrate 3. The isolation layer 15 may have an upper surface disposed on a level lower than that of the sacrificial layers 9a and 9b and the channel layers 12a and 12b. The isolation layer 15 may include silicon oxide. The isolation layer 15 may include a first device isolation layer 15a, a second device isolation layer 15b, and a third device isolation layer 15c. The first device isolation layer 15a may be disposed between the first active region 6a and the second active region 6b. The first active region 6a may be disposed between the first device isolation layer 15a and the second device isolation layer 15b. The second active region 6b may be disposed between the first device isolation layer 15a and the third device isolation layer 15c.

The first active structures 6a, 9a, and 12a and the second active structures 6b, 9b, and 12b may be parallel to each other. Each of the first active structures 6a, 9a, and 12a and the second active structures 6b, 9b, and 12b may have a line shape extending in the first direction X.

Preliminary line structures 18a, 18b, 18c, and 18d may be formed to traverse the first active structures 6a, 9a and 12a and the second active structures 6b, 9b and 12b to be parallel to each other. Each of the preliminary line structures 18a, 18b, 18c, and 18d may have a line shape extending in the second direction Y.

The preliminary line structures 18a, 18b, 18c, and 18d may include a first preliminary line structure 18a and a second preliminary line structure 18b parallel to each other and adjacent to each other, and a third preliminary line structure 18c and a fourth preliminary line structure 18d disposed on both sides of the first and second preliminary line structures 18a and 18b. The first and second preliminary line structures 18a and 18b may be disposed between the third preliminary line structure 18c and the fourth preliminary line structure 18d.

Each of the preliminary line structures 18a, 18b, 18c, and 18d may include a sacrificial gate 20 and a sacrificial mask 22 sequentially stacked, and gate spacers 25 covering side surfaces of the sequentially stacked sacrificial gate 20 and sacrificial mask 22.

The sacrificial gate 20 may be formed of a silicon oxide layer and a polysilicon layer sequentially stacked. The sacrificial mask 22 may include silicon oxide and/or silicon nitride. The gate spacers 25 may include an insulating material, for example, at least one of SiO, SiN, SiCN, SiOC, SiON, and SiOCN.

Figure 10:
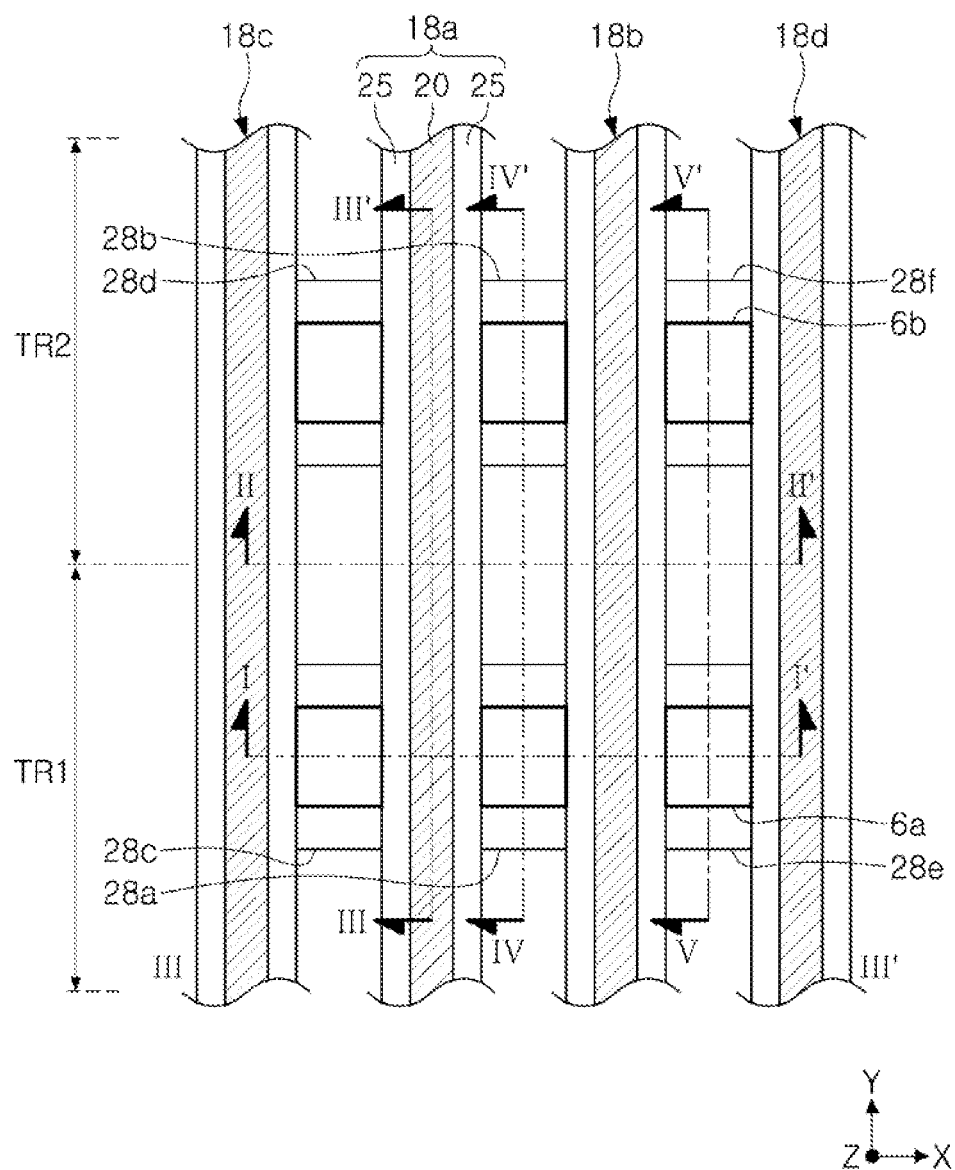
FIGS. 10 to 19D are diagrams illustrating an example of a method of forming a semiconductor device according to an example embodiment.
Figure 11A:
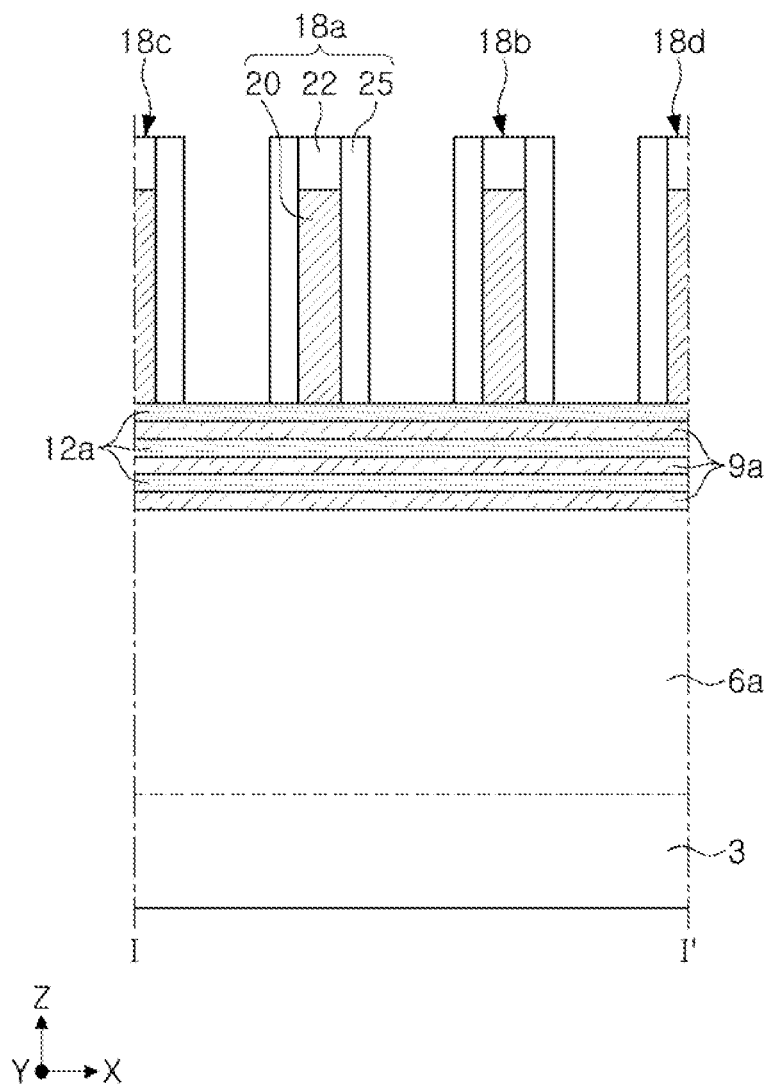
Figure 11B:
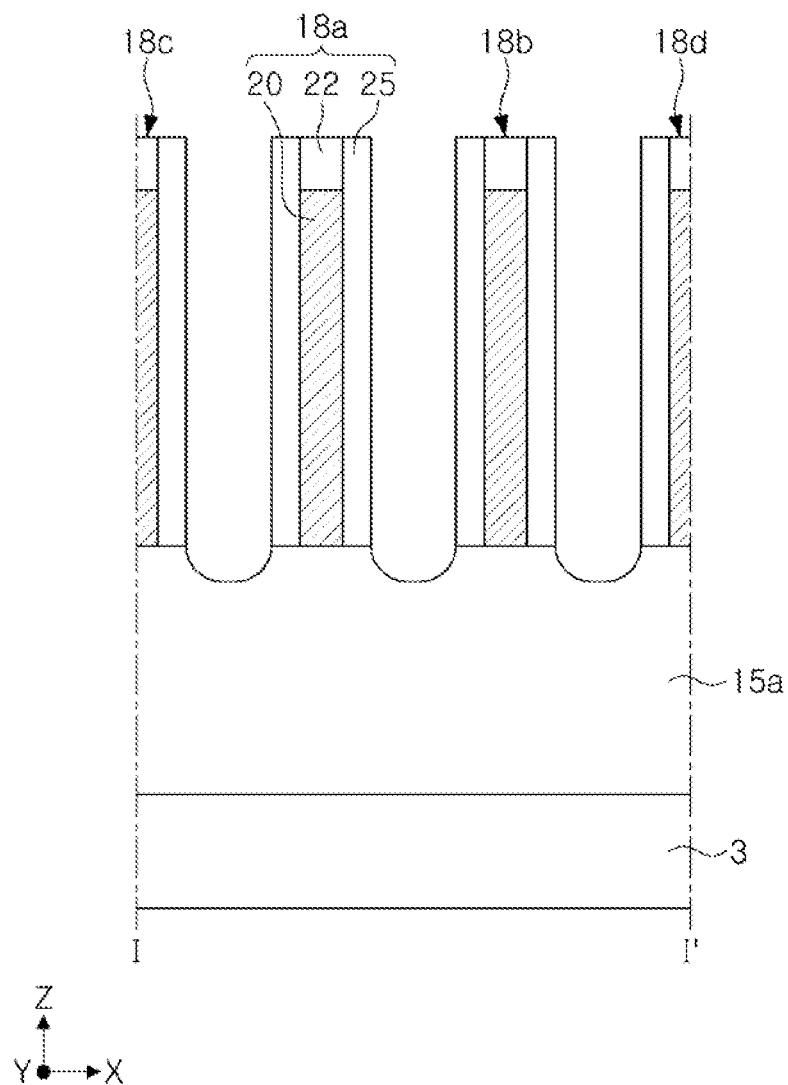
Figure 11C:
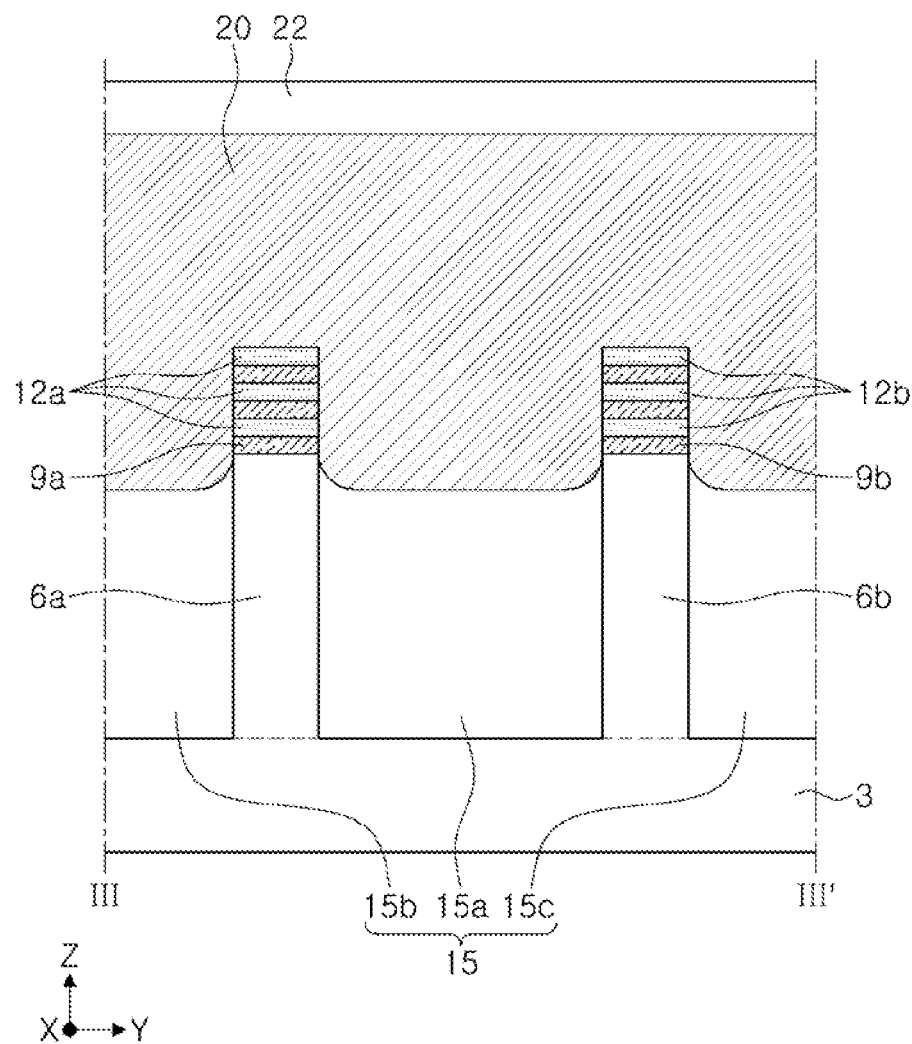
Figure 11D:
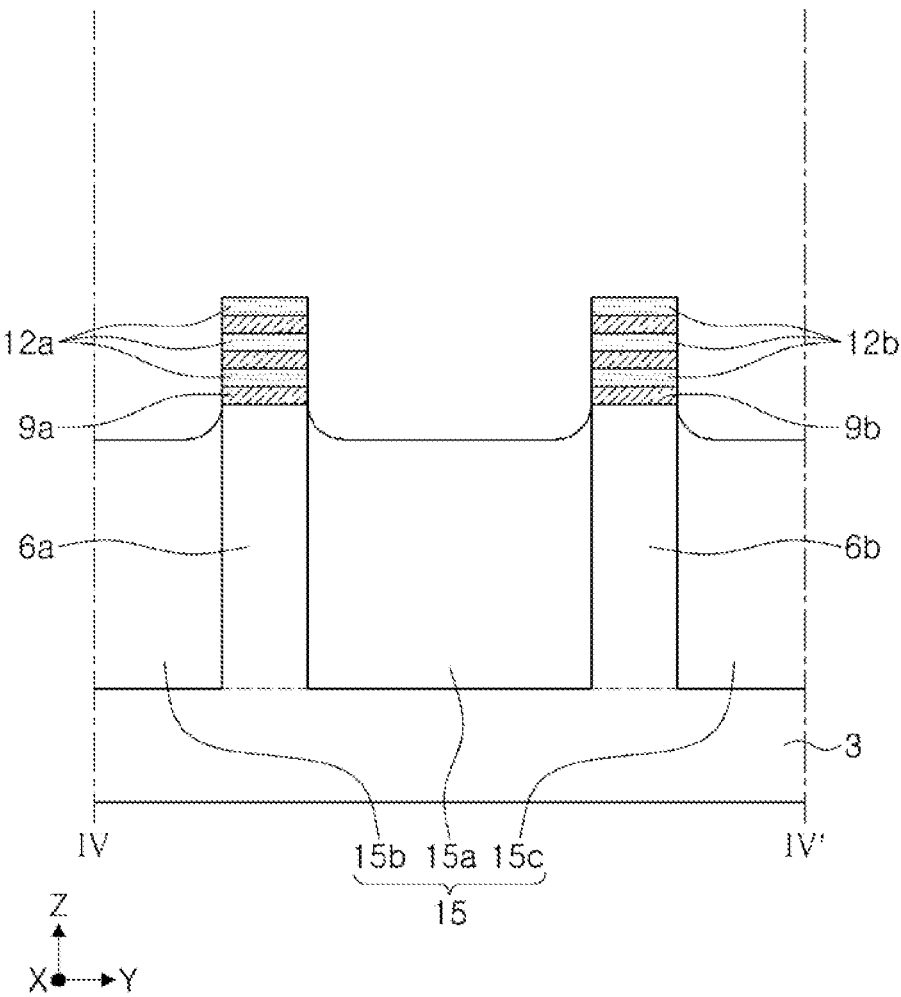
Figure 12A:
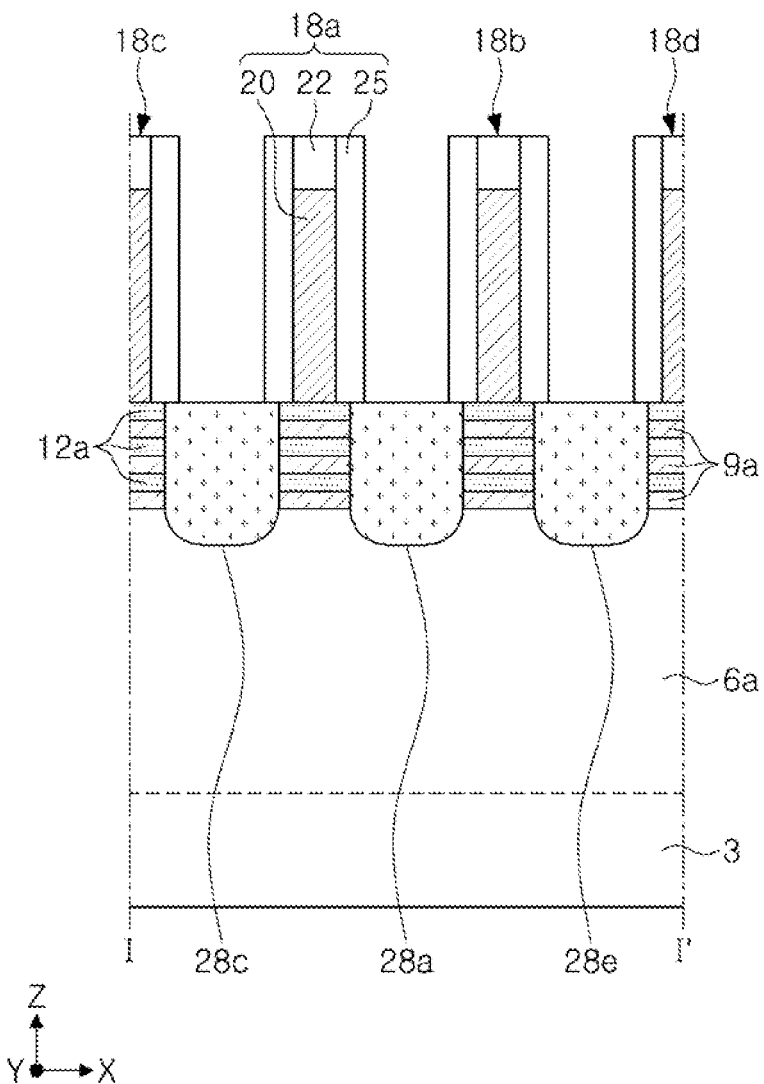
Figure 12B:
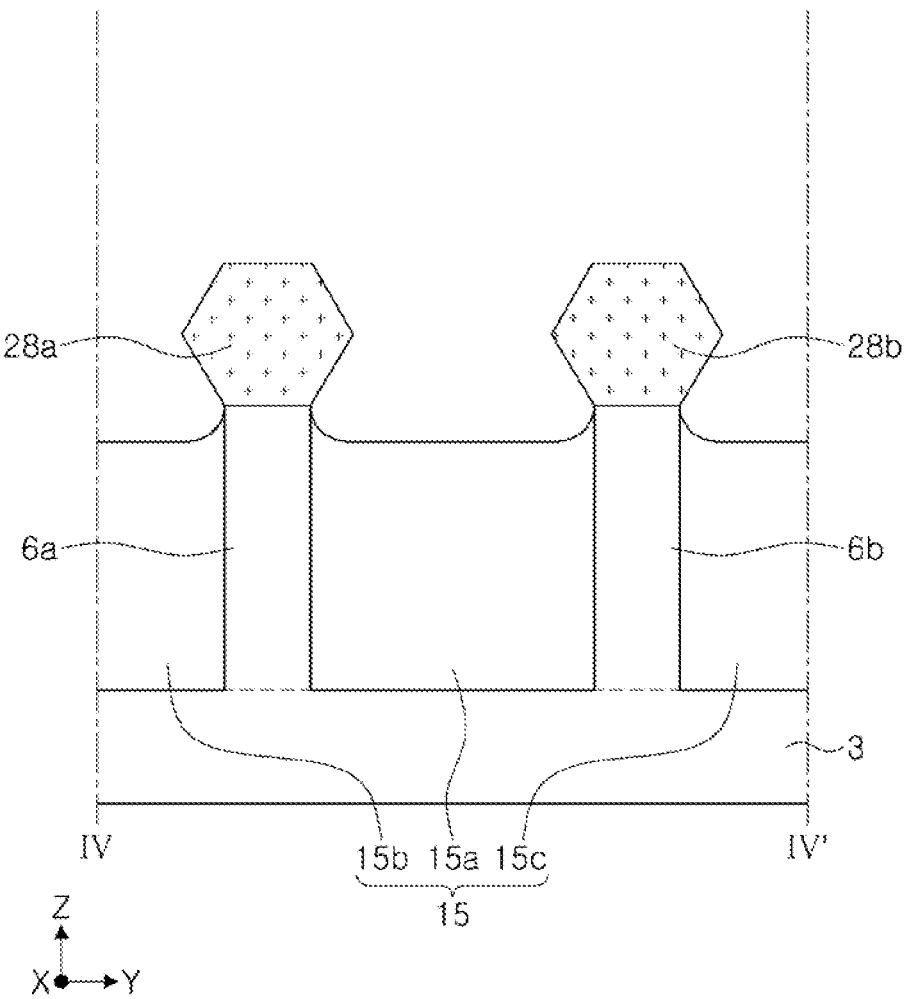
Figure 13A:
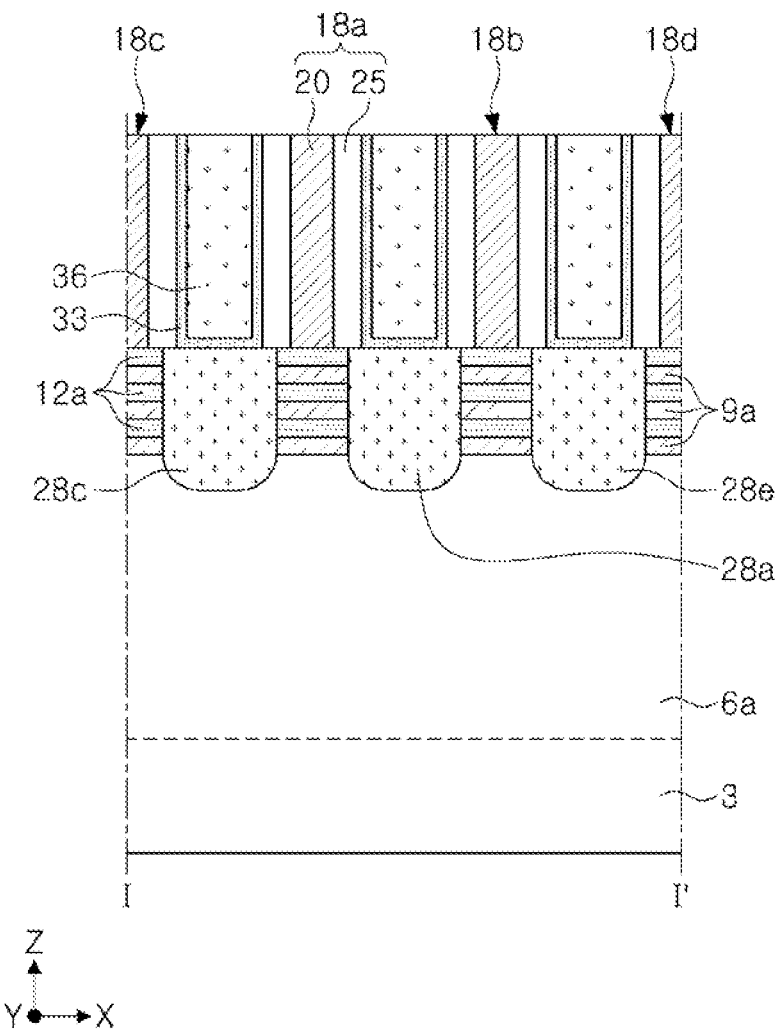
Figure 13B:
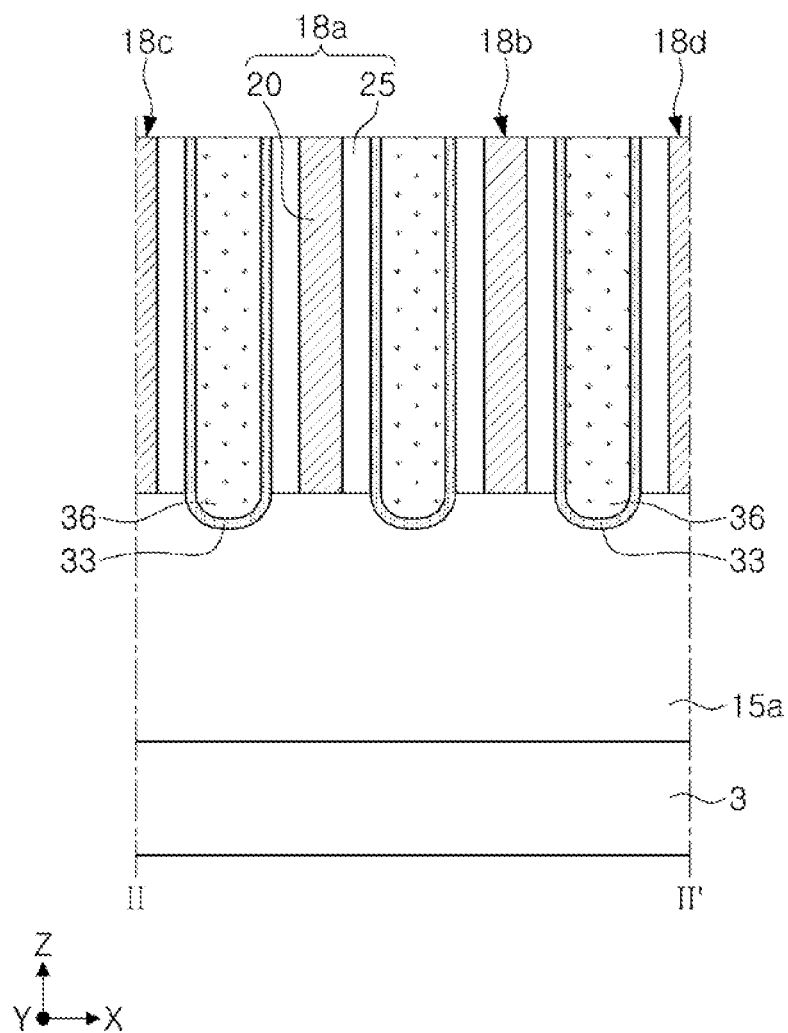
Figure 13C:
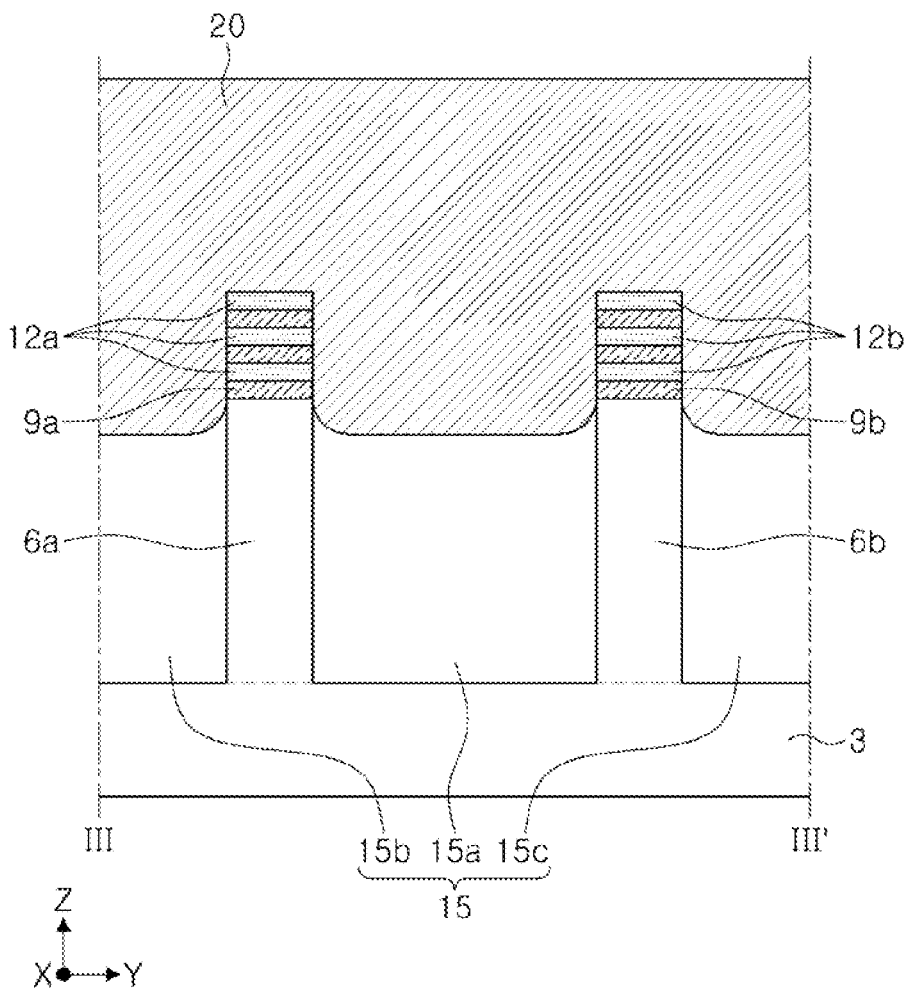
Figure 13D:
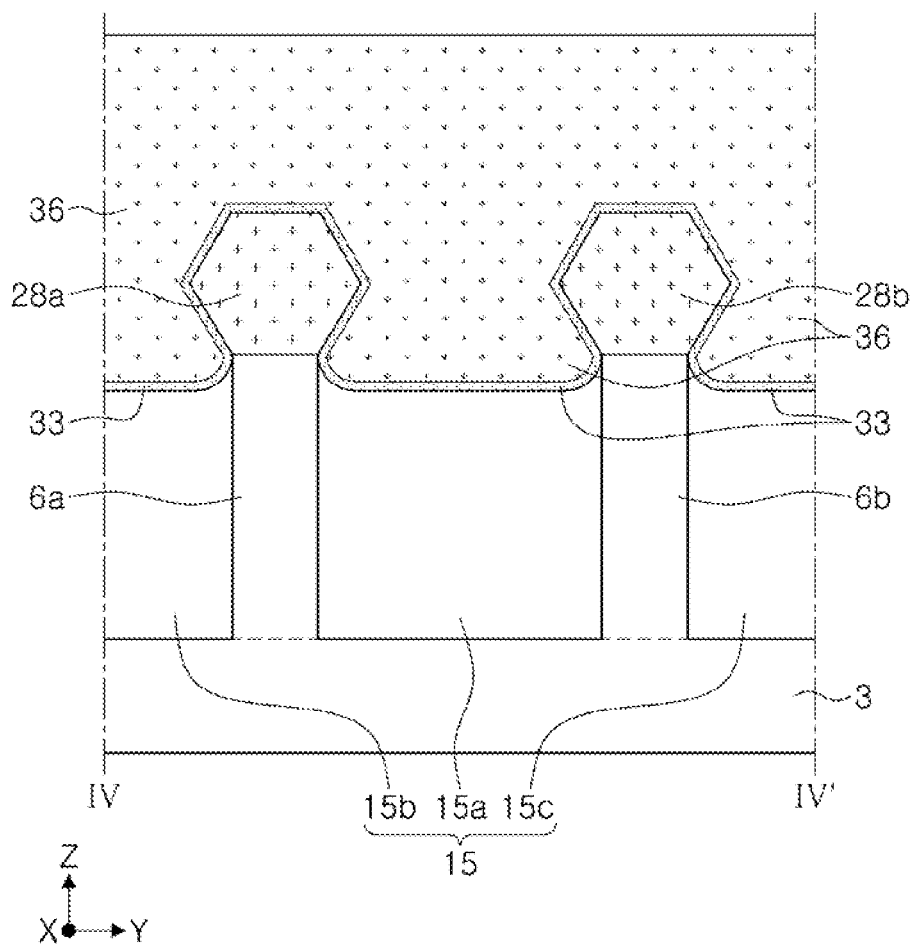
Figure 14:
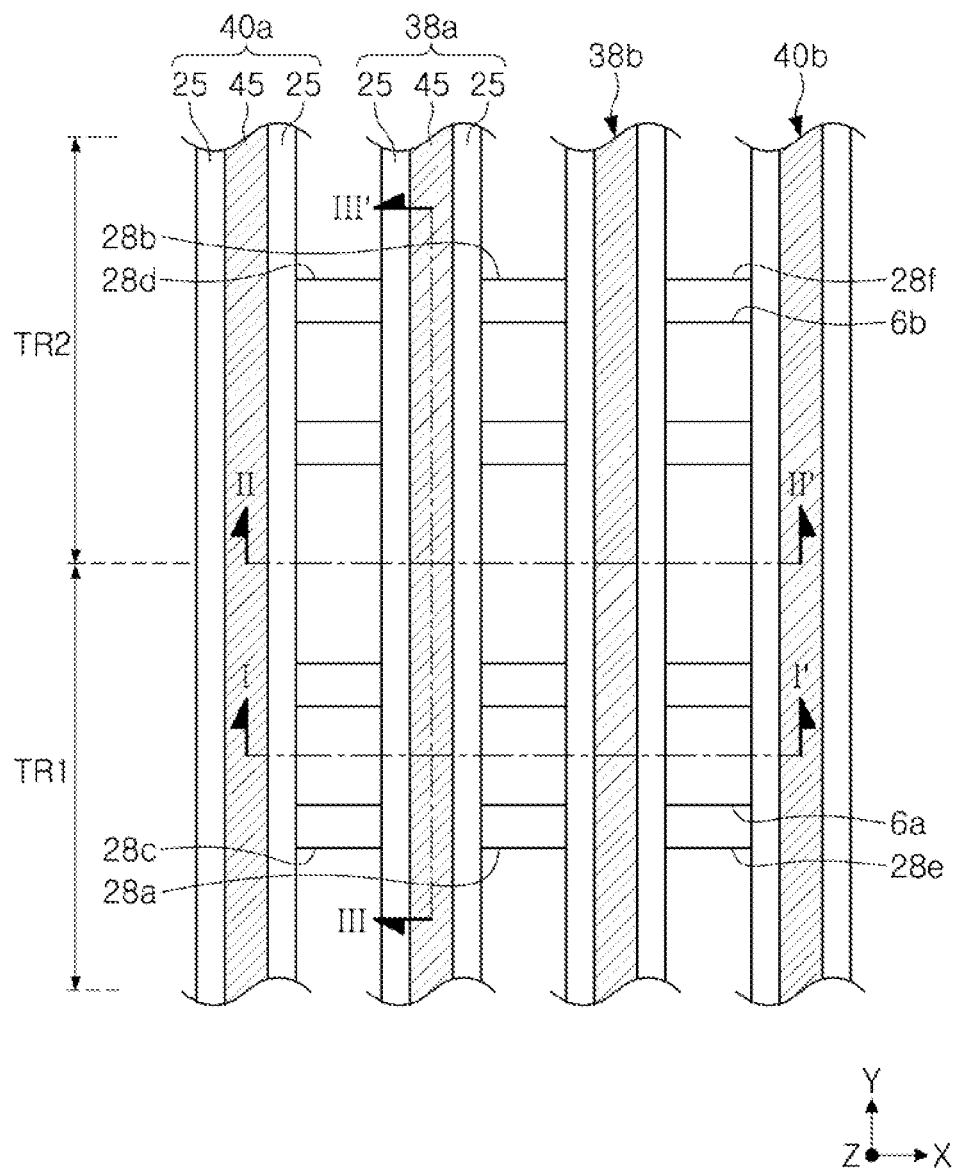
Figure 15A:
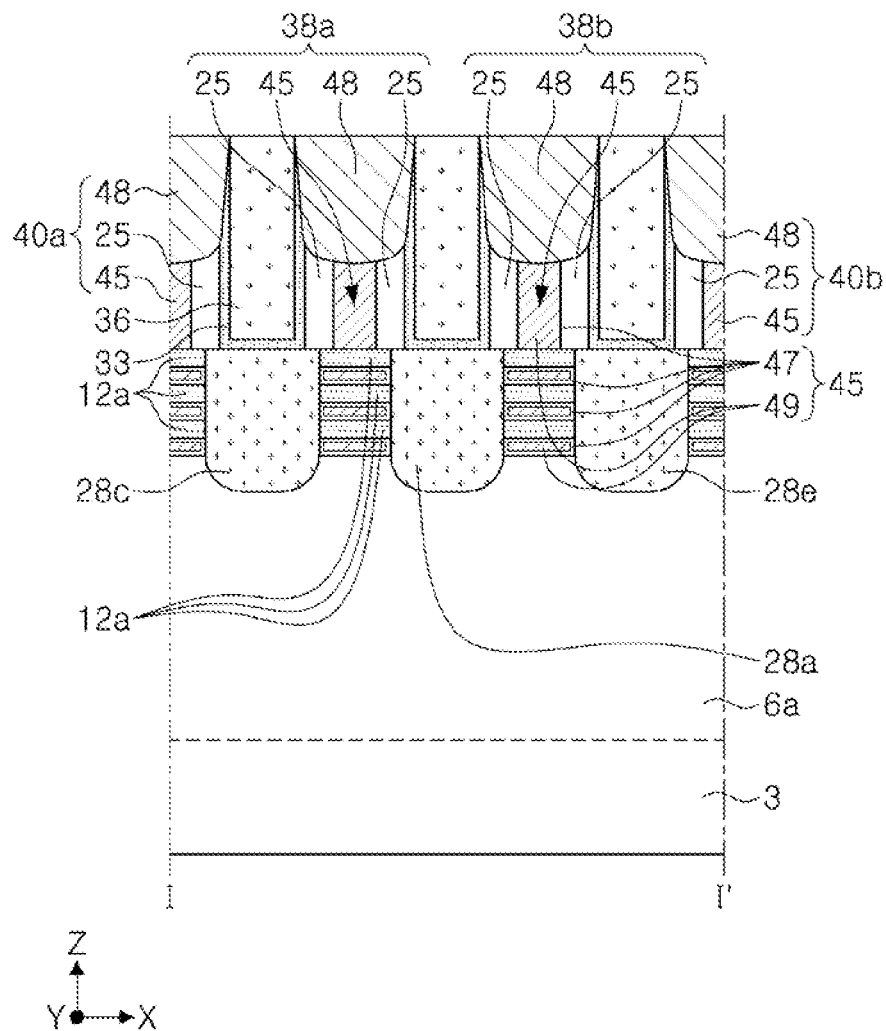
Figure 15B:
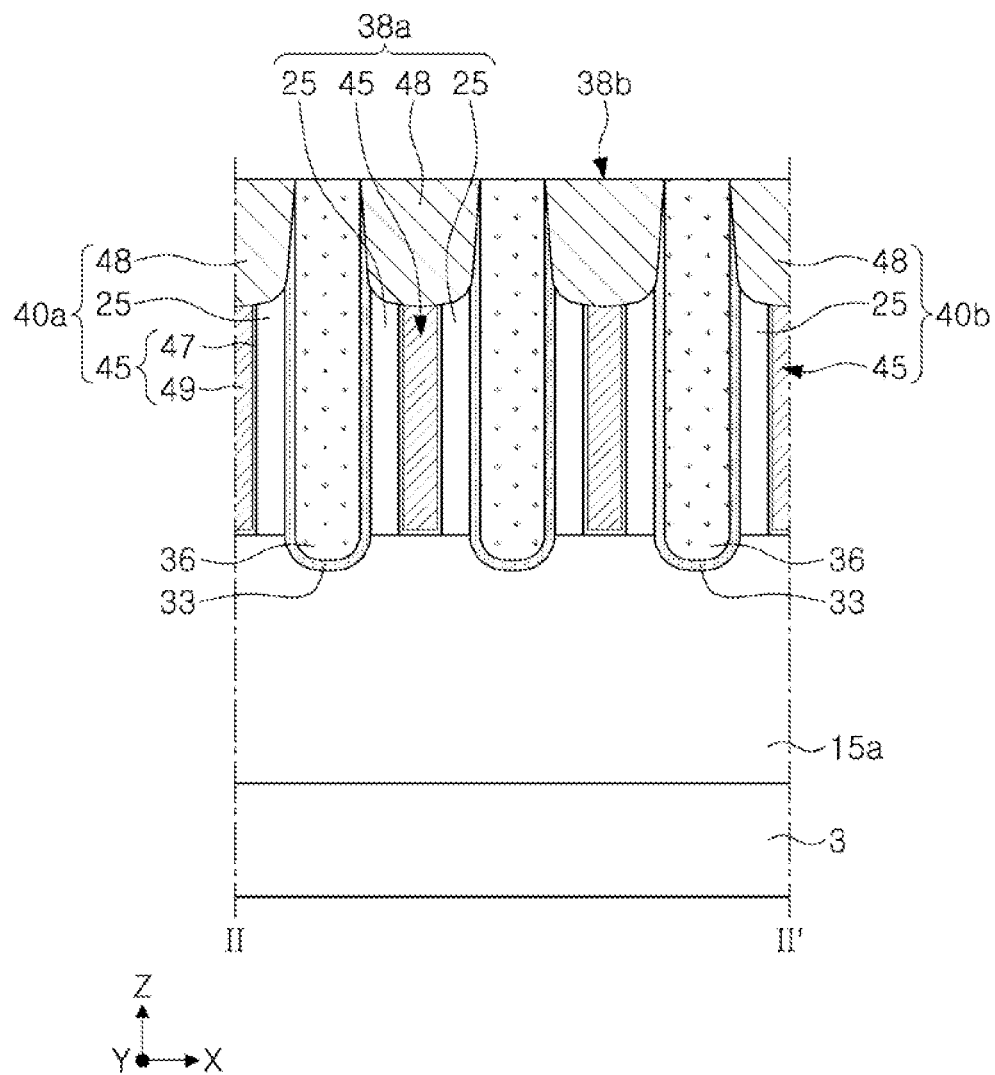
Figure 15C:
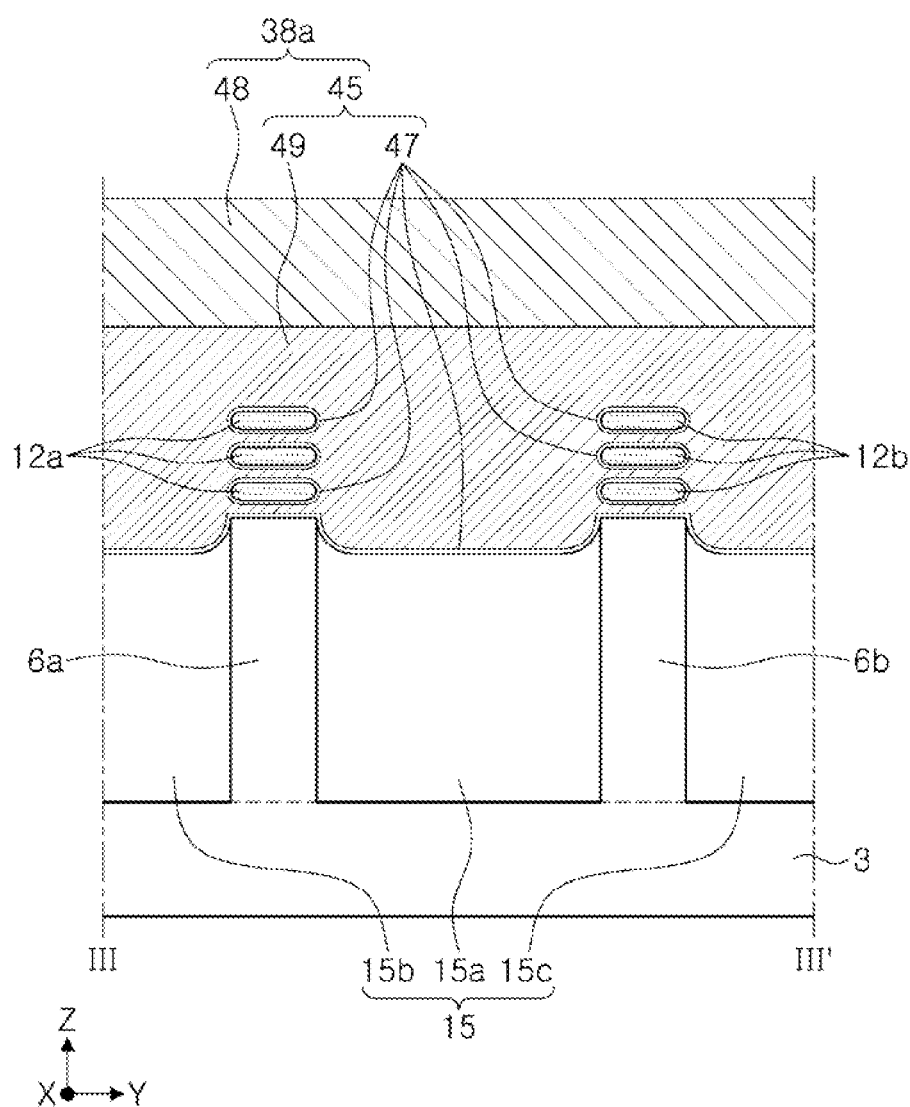
Figure 16:
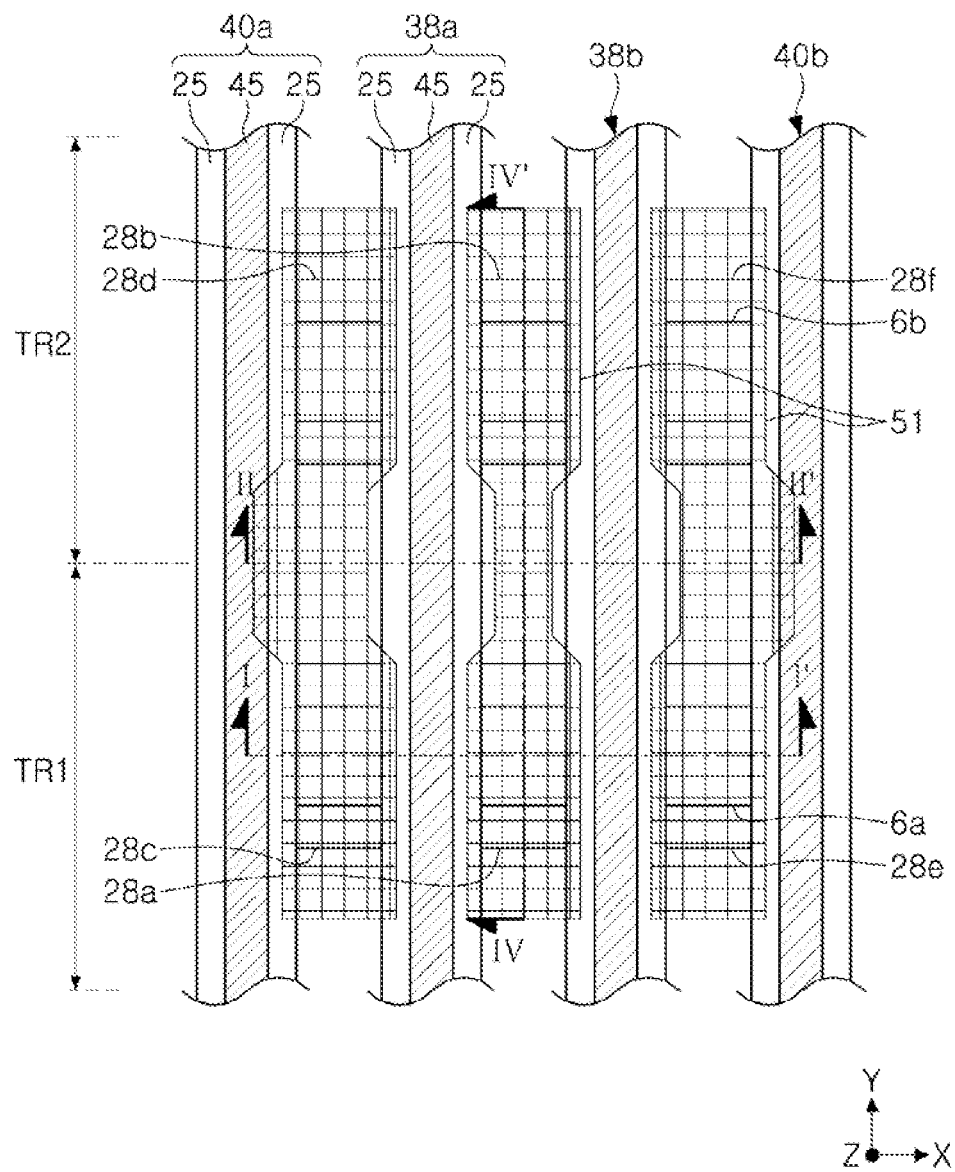
Figure 17A:
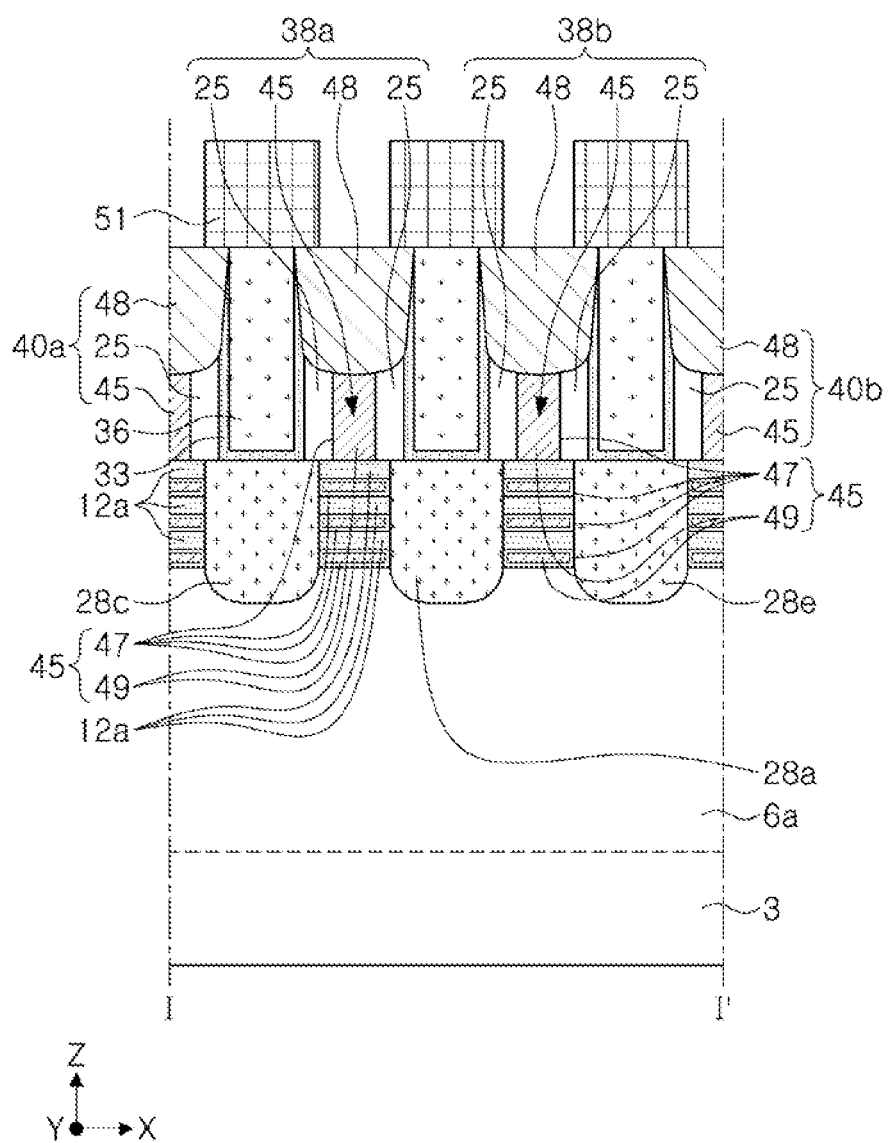
Figure 17B:
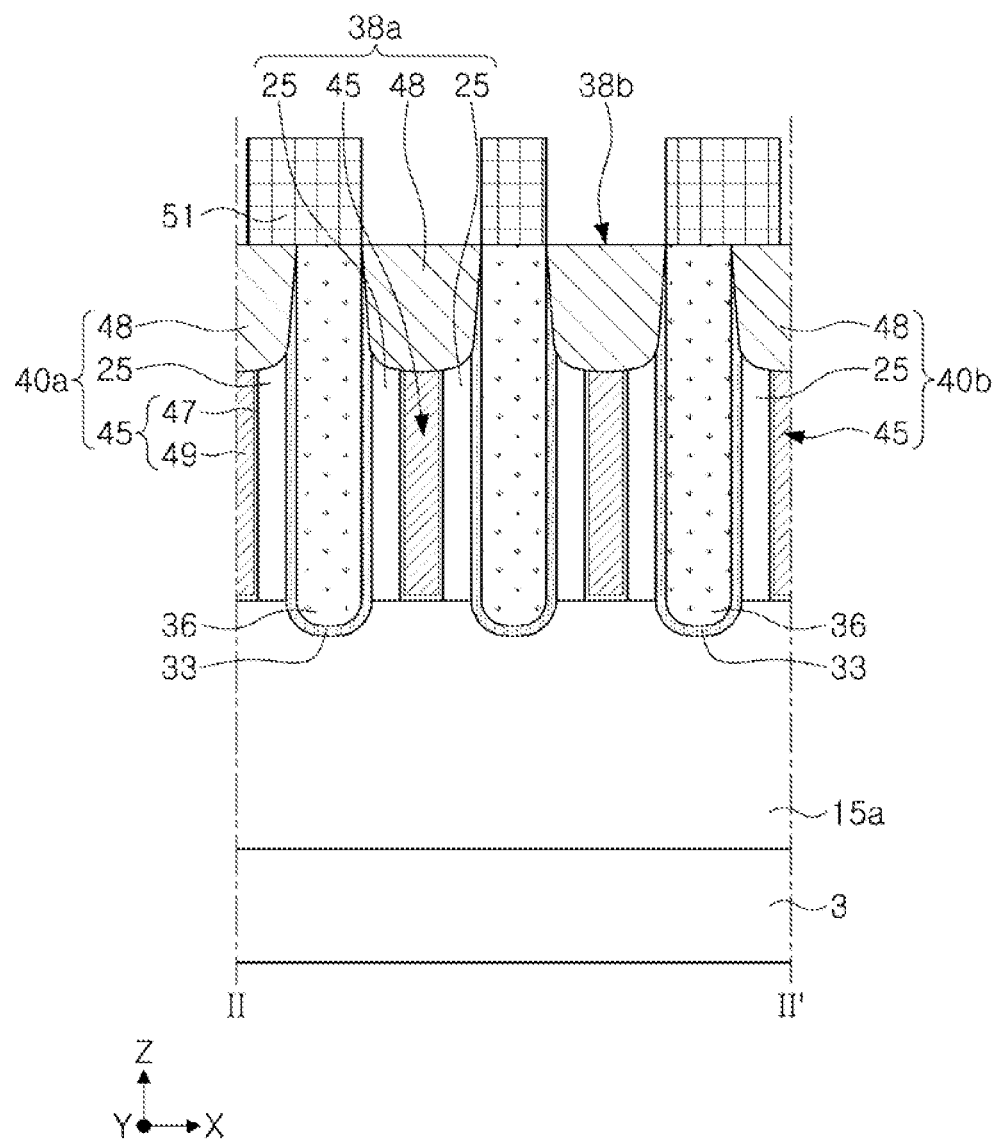
Figure 17C:
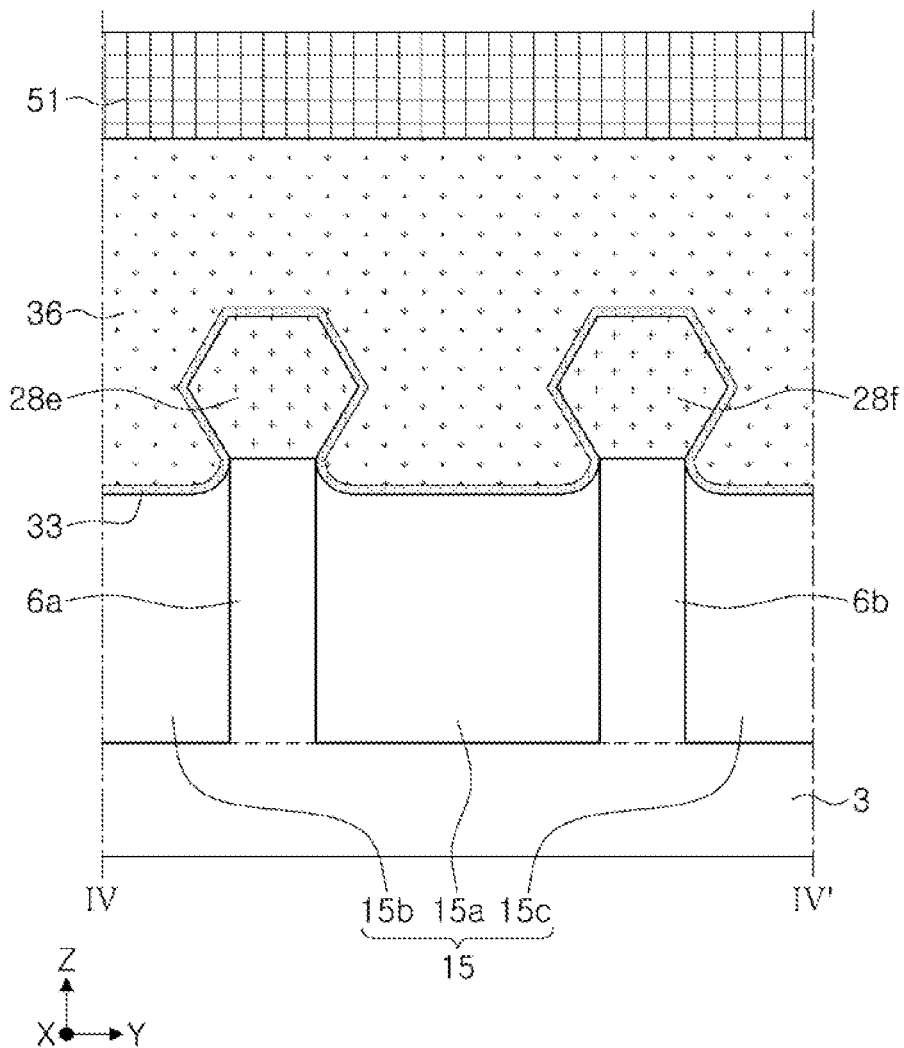
Figure 18:
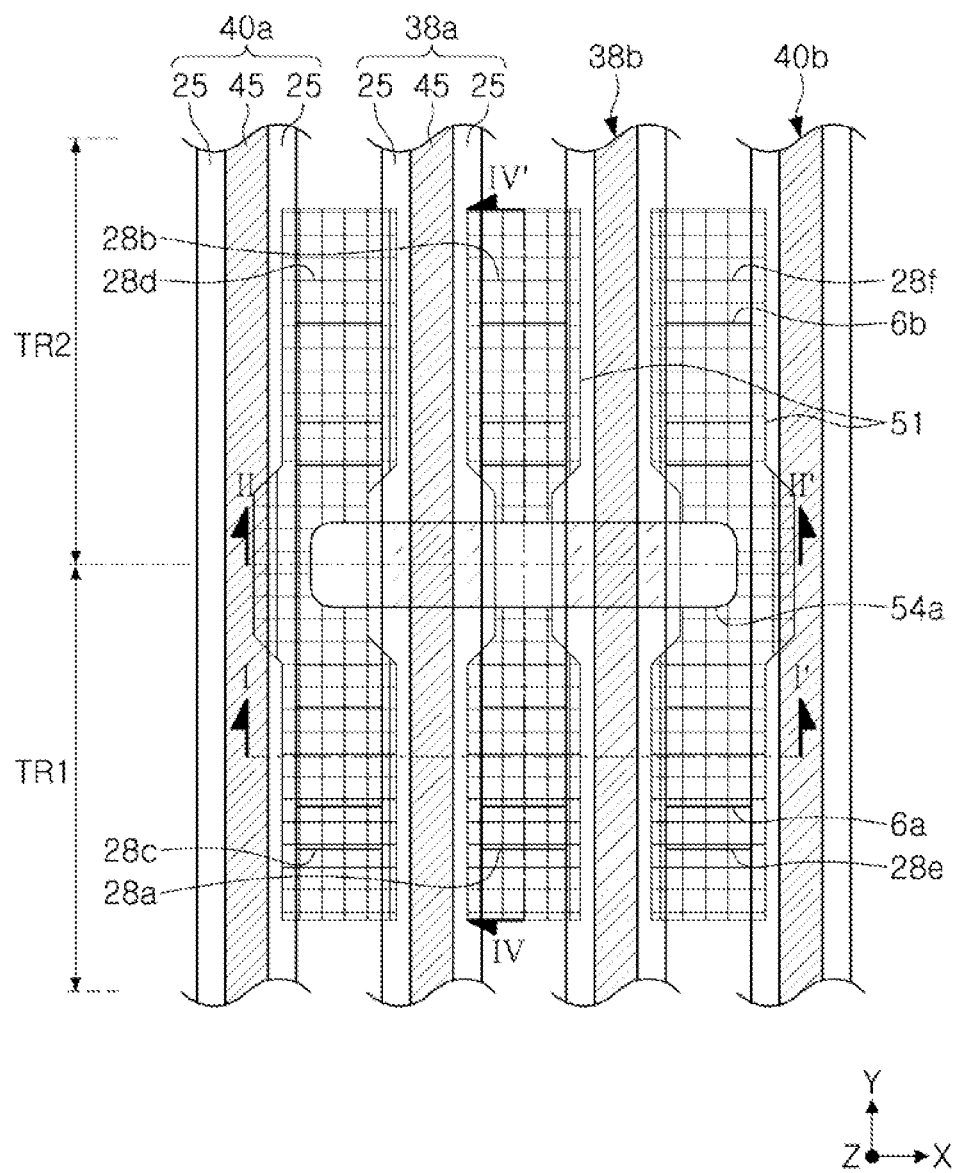
Figure 19A:
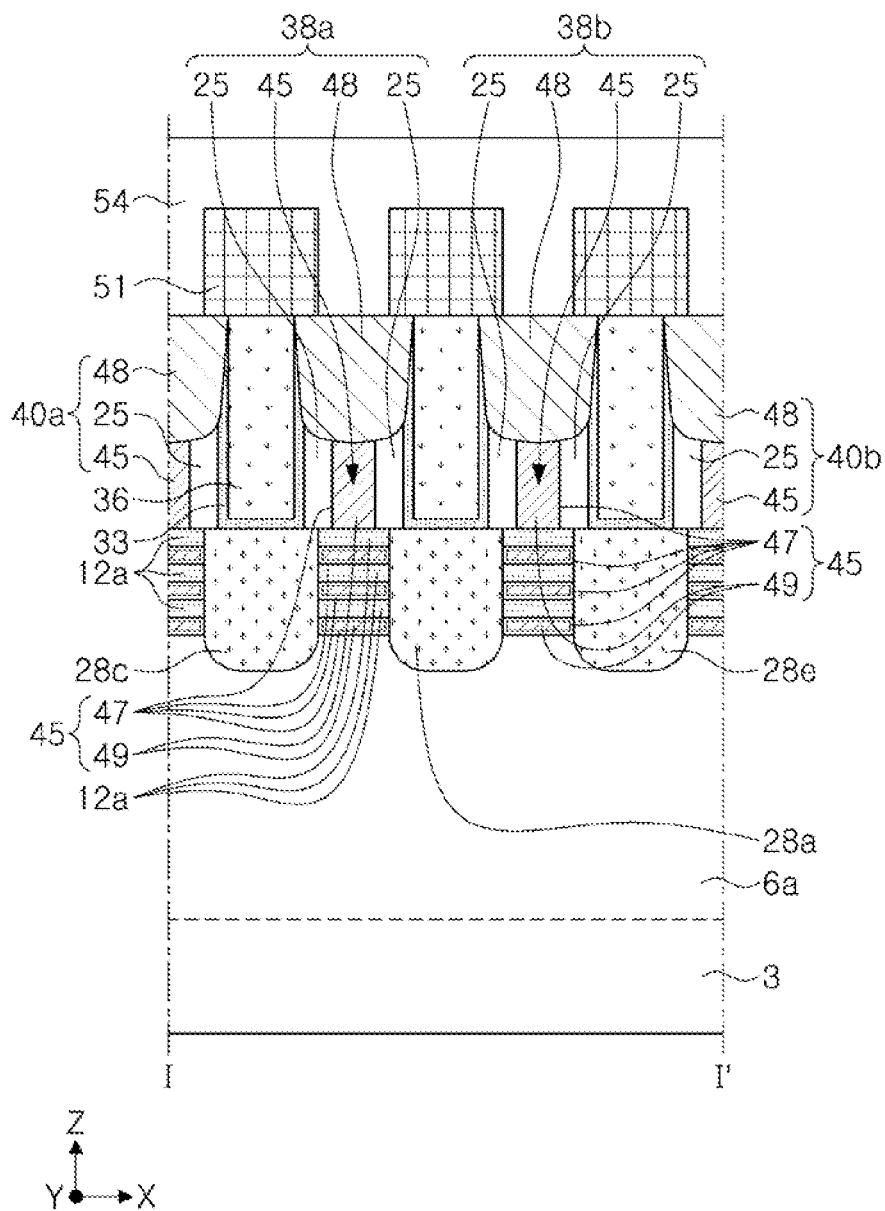
Figure 19B:
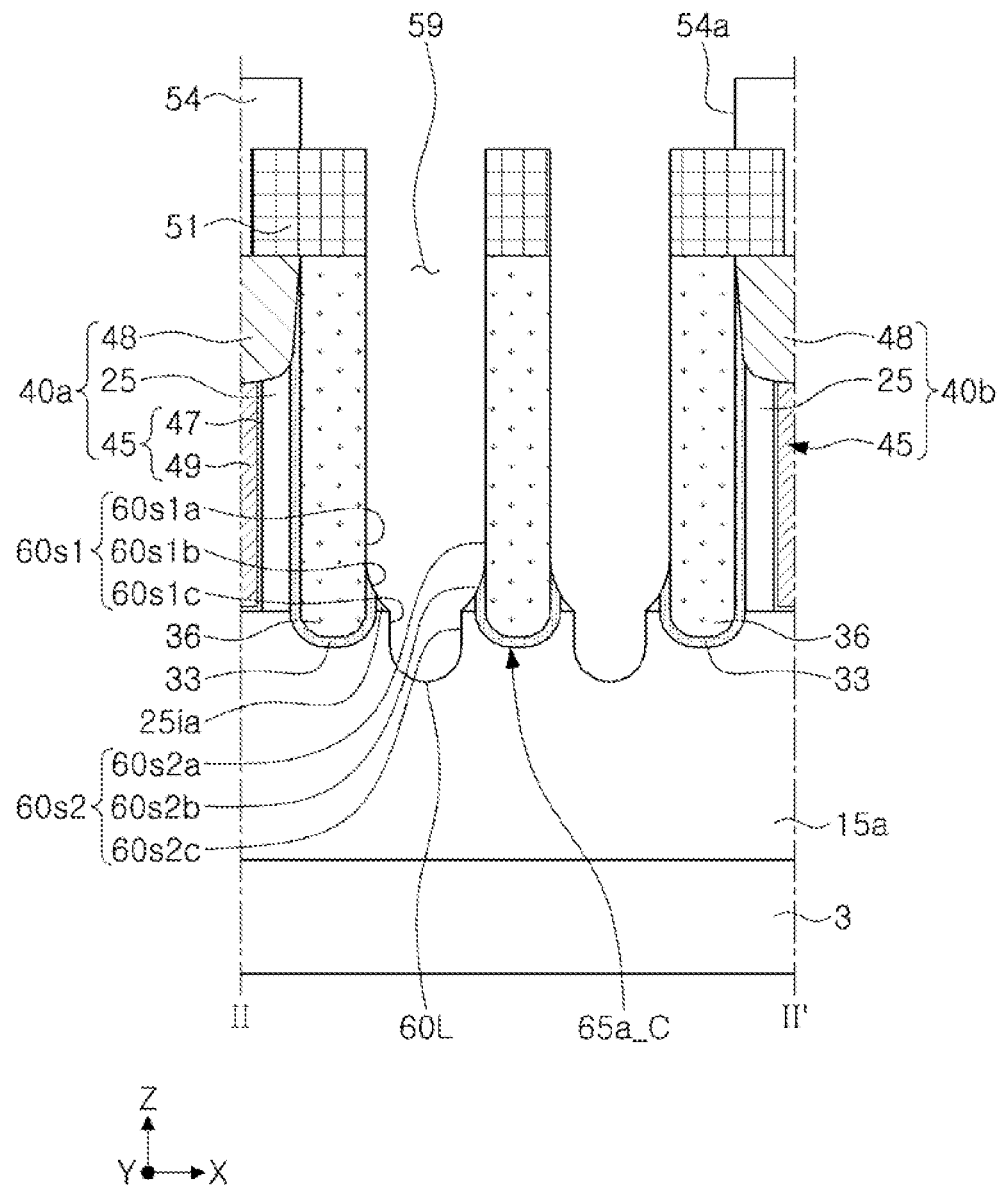
Figure 19C:
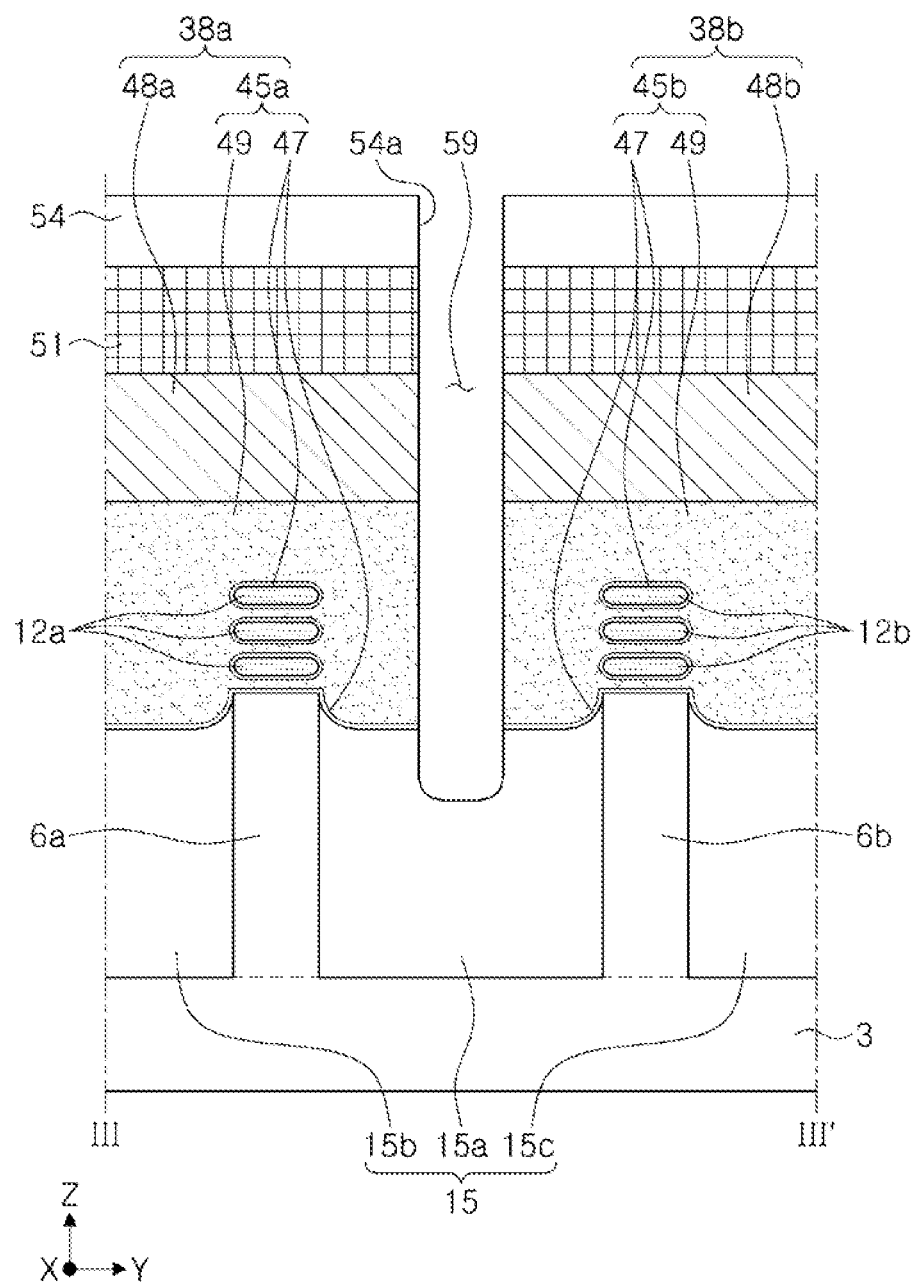
Figure 19D:
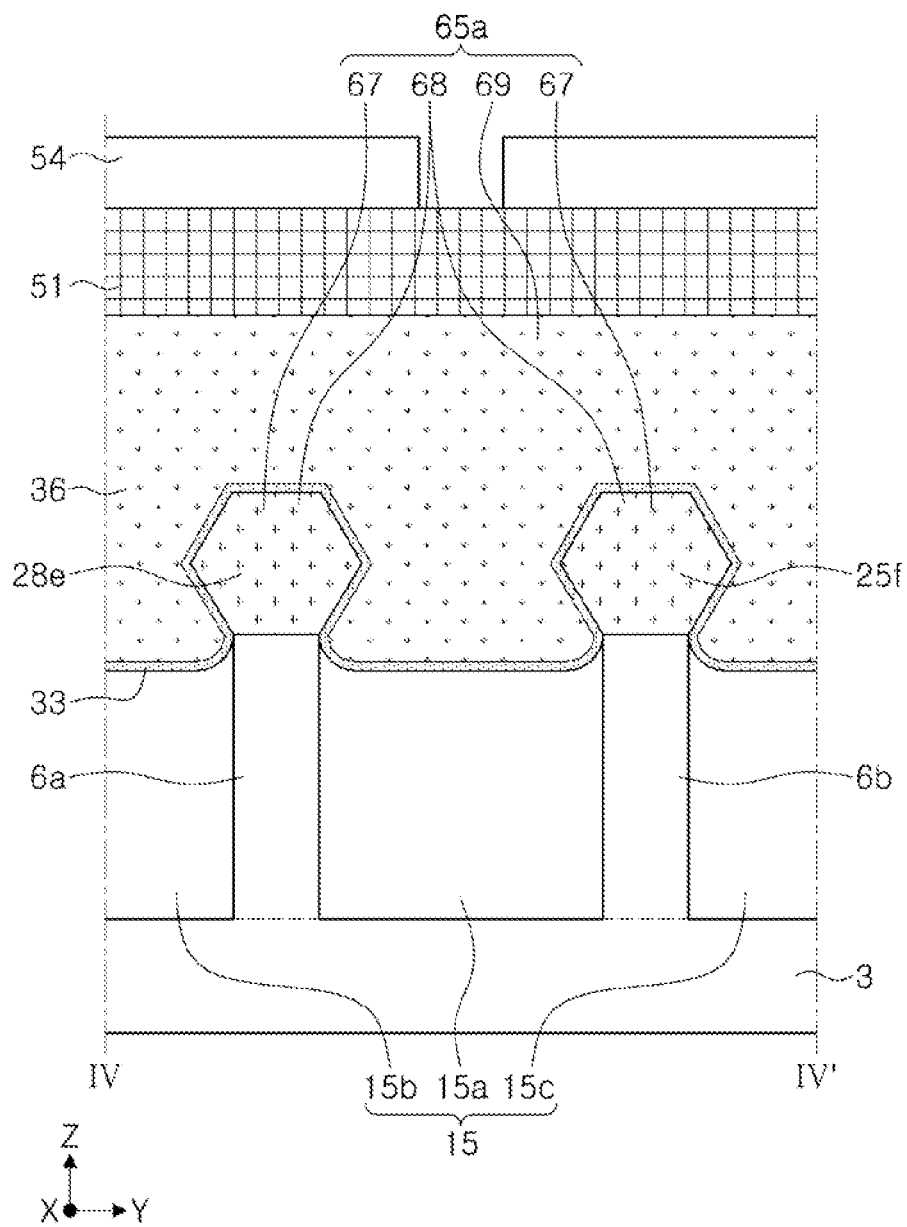

Referring to FIGS. 10, 12A, and 12B, using the preliminary line structures 18a, 18b, 18c, 18d as an etch mask, the first sacrificial layers 9a and the first channel layers 12a are etched to expose the first active region 6a having the first conductivity type, perform epitaxial growth from the first active region 6a, and form source/drain regions 28a, 28c and 28e having the second conductivity type.

The second sacrificial layers 9b and the first channel layers 12b are etched using the preliminary line structures 18a, 18b, 18c, and 18d as an etch mask, to expose the second active region 6b, perform epitaxial grown from the second active region 6b having the second conductivity type, and form source/drain regions 28b, 28d, and 28f having the first conductivity type.

The source/drain regions 28a, 28c, 28e having the second conductivity type and the source/drain regions 28b, 28d, 28f having the first conductivity type may be formed in different process operations.

Referring to FIGS. 10, 13A, 13B, 13C and 13D, an insulating liner 33 and an interlayer insulating layer 36 are sequentially formed, and a planarization process is performed until sacrificial gates 20 are exposed. Accordingly, the sacrificial mask 22 may be removed by the planarization process. The interlayer insulating layer 36 may be formed of silicon oxide or a low dielectric material, and the insulating liner 33 may be formed of a material different from that of the interlayer insulating layer 36, for example, a silicon nitride or silicon nitride-based insulating material.

Referring to FIGS. 14, 15A, 15B and 15C, the sacrificial gates 20 are selectively removed to expose the sacrificial layers 9a and 9b, and the sacrificial layers 9a and 9b are selectively removed, and gate patterns 45 may be formed in spaces from which the sacrificial gates 20 and the sacrificial layers 9a and 9b have been removed. Subsequently, the gate patterns 45 and the gate spacers 25 are partially etched to lower the height of the upper surface, and gate capping patterns 48 may be formed in the space formed as the upper surfaces of the gate patterns 45 and the gate spacers 25 are lowered. The gate capping patterns 48 may be formed of silicon nitride or a silicon nitride-based insulating material.

Each of the gate patterns 45 may include a gate dielectric layer 47 and a gate electrode 49 disposed on the gate dielectric layer 47. The gate patterns 45 may extend to surround the channel layers 12a and 12b.

The first and second preliminary line structures 18a and 18b described above may be formed of first and second preliminary line structures 38a and 38b including the gate pattern 45 instead of the sacrificial gate 20 and the sacrificial mask 22. The third and fourth preliminary line structures 18c and 18d described above may be formed of third and fourth line structures 40a and 40b including the gate pattern 45, respectively. Accordingly, each of the first and second preliminary line structures 38a and 38b and each of the third and fourth line structures 40a and 40b may include the gate pattern 45, the gate spacers 25 covering both sides of the gate pattern 45, and a gate capping pattern 48 on the gate pattern 45 and the gate spacers 25.

Referring to FIGS. 16, 17A, 17B, and 17C, first mask patterns 51 may be formed. The first mask patterns 51 may be disposed on the interlayer insulating layers 36, and may each have a line shape extending in the second direction Y.

At least one of the first mask patterns 51 may have a line shape in which a width is narrowed in a boundary region between the first transistor region TR1 and the second transistor region TR2. For example, when viewed in a plan view (see, e.g., FIG. 16), portions of at least one of the first mask patterns 51, overlapping the first active region 6a and the second active region 6b, respectively, may have a first width, and a portion thereof between the first active region 6a and the second active region 6b may have a second width less than the first width.

In a plan view, the areas of the first and second preliminary line structures 18a and 18b exposed by the first mask patterns 51, between the first active region 6a and the second active region 6b, may be increased.

Referring to FIGS. 18, 19A, 19B, 19C and 19D, when viewed in a plan view, a second mask pattern 54 having an opening 54a exposing a partial region between the first active region 6a and the second active region 6b may be formed.

The first and second preliminary line structures 38a and 38b may be exposed while spaces between the opening 54a of the second mask pattern 54 and the first mask patterns 51 overlap. Then, the exposed first and second preliminary line structures 38a and 38b may be etched to form separation holes 59. For example, forming the separation holes 59 by etching the exposed first and second preliminary line structures 38a and 38b may include exposing the gate capping patterns 48 of the first and second preliminary line structures 38a and 38b while the spaces between the opening 54a of the second mask pattern 54 and the first mask patterns 51 overlap, exposing the gate patterns 45 and the gate spacers 25 by etching the gate capping patterns 48, and etching the exposed gate patterns 45 and the gate spacers 25.

In the etching process for forming the separation holes 59, a portion of the gate spacers 25 may remain.

In another example, in the etching process for forming the separation holes 59, the gate spacers 25 may be etched to expose the first device isolation layer 15a below the gate spacers 25.

Referring again to FIGS. 1 and 2A to 2E, first and second insulating separation patterns 60a and 60b filling the separation holes 59 may be formed. The first and second insulating separation patterns 60a and 60b may constitute the first line structures 42a, 60a, and 42b and the second line structures 42c, 60b and 42d described above with reference to FIGS. 1 and 2A to 2E. Subsequently, contact plugs 65a, 65b, 65c, 65d, and 65e may be formed to penetrate through the interlayer insulating layers 36 and the insulating liner 33.

Forming the contact plugs 65a, 65b, 65c, 65d and 65e may include forming contact holes penetrating through at least the interlayer insulating layers 36 and the insulating liner 33 by performing a photo and etching process, filling the contact holes with a conductive material, and performing a planarization process until the gate capping patterns 48a, 48b, 48c and 48 are exposed. By the planarization process, upper surfaces of the gate capping patterns 48a, 48b, 48c, 48, the interlayer insulating layer 36, the first and second insulating separation patterns 60a and 60b, and the contact plugs 65a, 65b, 65c, 65d, and 65e may be formed at substantially the same height level. In the process of forming contact holes penetrating through at least the interlayer insulating layers 36 and the insulating liner 33, the first mask patterns 51 may prevent the interlayer insulating layers 36 from collapsing or being deformed. Accordingly, in the process of forming the contact plugs 65a, 65b, 65c, 65d, and 65e, defects caused by the collapse or deformation of the interlayer insulating layers 36 may be prevented.

According to an etching process for forming the first and second insulating separation patterns 60a and 60b or an etching process used to form the contact plugs 65a, 65b, 65c, 65d, and 65e, various structures such as those described with reference to FIGS. 3 to 9 may be formed.

As set forth above, according to example embodiments, a method of separating a gate electrode in a line structure extending in one direction, and a semiconductor device formed according to the method, may be provided. For example, to separate the gate electrode, mask patterns extending in the same longitudinal direction as that of the gate electrode are formed on the interlayer insulating layers to prevent the interlayer insulating layers from collapsing or being deformed, and an additional mask having an opening for separating the gate electrode is formed to divide the gate electrode into two gate electrodes. The mask patterns may be formed to have a narrow width in the region where the gate electrode is separated such that the gate spacer in the region where the gate electrode is separated may be etched together. Accordingly, by separating the gate electrode using the mask patterns and the additional mask, a defect caused by the gate electrode not being completely separated may be prevented.

While example embodiments have been illustrated and described above, it will be apparent to those skilled in the art that modifications and variations could be made without departing from the scope of the disclosure as defined by the appended claims.

What is claimed is:
1. A semiconductor device comprising:
a substrate;
a first active region and a second active region extending parallel to each other in a first direction, on the substrate;
an isolation layer disposed between the first active region and the second active region;
a line structure disposed on the substrate, overlapping the first and second active regions and the isolation layer, and extending in a second direction that is perpendicular to the first direction;
a first source/drain region disposed on the first active region;
a second source/drain region disposed on the second active region;
a common contact plug disposed on a first side of the line structure, contacting the first source/drain region and the second source/drain region, and overlapping the isolation layer; and
an interlayer insulating layer disposed on a second side of the line structure, on the isolation layer,
wherein the line structure is disposed on the isolation layer and between the common contact plug and the interlayer insulating layer,
the line structure comprises a first gate structure overlapping the first active region and extending on the isolation layer, a second gate structure overlapping the second active region and extending on the isolation layer, and an insulating separation pattern disposed between the first gate structure and the second gate structure and extending into the isolation layer,
at least a portion of the insulating separation pattern is disposed between the common contact plug and the interlayer insulating layer,
the insulating separation pattern has a first side surface and a second side surface opposing each other in the first direction, and a third side surface and a fourth side surface opposing each other in the second direction,
at least one of the first side surface and the second side surface of the insulating separation pattern comprises a first portion, a second portion on a level lower than the first portion, and a third portion on a level lower than the second portion, and
a slope of each of the first portion and the third portion is steeper than a slope of the second portion.

2. The semiconductor device of claim 1, wherein the first gate structure comprises a first gate pattern, a first gate spacer disposed on one side of the first gate pattern, and a second gate spacer disposed on another side of the first gate pattern,
the second gate structure comprises a second gate pattern, a third gate spacer disposed on one side of the second gate pattern, and a fourth gate spacer disposed on another side of the second gate pattern,
the first gate pattern comprises a first gate dielectric layer and a first gate electrode disposed on the first gate dielectric layer,
the second gate pattern comprises a second gate dielectric layer and a second gate electrode disposed on the second gate dielectric layer,
the first gate electrode contacts the first side surface of the insulating separation pattern, and
the second gate electrode contacts the second side surface of the insulating separation pattern.

3. The semiconductor device of claim 2, wherein the line structure further comprises a connection spacer extending between the first gate spacer and the third gate spacer,
the first side surface of the insulating separation pattern comprises the first portion, the second portion, and the third portion, and
an upper end of the connection spacer contacts the second portion.

4. The semiconductor device of claim 3, wherein the first side surface of the insulating separation pattern comprises the first portion, the second portion, and the third portion, and
the third portion is in contact with the isolation layer.

5. The semiconductor device of claim 2, wherein the first gate structure further comprises a first insulating capping pattern disposed on the first gate pattern,
the second gate structure further comprises a second insulating capping pattern disposed on the second gate pattern, and
upper surfaces of the first insulating capping pattern, the insulating separation pattern, the second insulating capping pattern and the interlayer insulating layer are coplanar with each other.

6. The semiconductor device of claim 5, wherein the first insulating capping pattern covers upper surfaces of the first and second gate spacers, and
the second insulating capping pattern covers upper surfaces of the third and fourth gate spacers.

7. The semiconductor device of claim 1, further comprising an insulating liner covering a lower surface of the interlayer insulating layer,
wherein the insulating liner extends from the lower surface of the interlayer insulating layer to cover at least a portion of a side surface of the interlayer insulating layer, and
a portion of the insulating liner contacts with the insulating separation pattern.

8. The semiconductor device of claim 1, wherein the common contact plug comprises a portion extending into the isolation layer, and
a lowermost end of the common contact plug is disposed on a level lower than an upper surface of the first active region and an upper surface of the second active region.

9. The semiconductor device of claim 1, further comprising:
an insulating liner disposed between the interlayer insulating layer and the isolation layer.

10. The semiconductor device of claim 1, wherein, when viewed in a plan view, a side surface of the common contact plug has a concave shape in a region that contacts or is adjacent to the insulating separation pattern of the line structure.

11. The semiconductor device of claim 1, wherein in a region of the common contact plug overlapping the isolation layer and adjacent to the insulating separation pattern of the line structure, a lower surface of the common contact plug has a convex shape in a direction away from an upper surface of the substrate.

12. A semiconductor device comprising:
a substrate;
a first active region and a second active region extending parallel to each other in a first direction, on the substrate;
an isolation layer disposed between the first active region and the second active region;
a first line structure and a second line structure overlapping the first and second active regions and the isolation layer, and extending parallel to each other in a second direction that is perpendicular to the first direction, on the substrate;
a first source/drain region disposed on the first active region; and
a second source/drain region disposed on the second active region,
wherein the first line structure comprises:
a first gate structure overlapping the first active region and extending on the isolation layer,
a second gate structure overlapping the second active region and extending on the isolation layer, and
a first insulating separation pattern disposed between the first gate structure and the second gate structure and extending into the isolation layer,
the second line structure comprises:
a third gate structure overlapping the first active region and extending on the isolation layer,
a fourth gate structure overlapping the second active region and extending on the isolation layer, and
a second insulating separation pattern disposed between the third gate structure and the fourth gate structure and extending into the isolation layer,
the first insulating separation pattern and the second insulating separation pattern are spaced apart from each other,
the first insulating separation pattern has a first side surface and a second side surface opposing each other in the first direction, and a third side surface and a fourth side surface opposing each other in the second direction, and
at least one of the first side surface and the second side surface of the first insulating separation pattern and at least one of the third side surface and the fourth side surface of the first insulating separation pattern have different side profiles.

13. The semiconductor device of claim 12, wherein the first gate structure comprises a first gate pattern, a first gate spacer disposed on one side of the first gate pattern, a second gate spacer disposed on another side of the first gate pattern, and a first insulating capping pattern on the first gate pattern and the first and second gate spacers,
the second gate structure comprises a second gate pattern, a third gate spacer disposed on one side of the second gate pattern, a fourth gate spacer disposed on another side of the second gate pattern, and a second insulating capping pattern on the second gate pattern and the third and fourth gate spacers,
the first gate pattern comprises a first gate dielectric layer and a first gate electrode on the first gate dielectric layer,
the second gate pattern comprises a second gate dielectric layer and a second gate electrode on the second gate dielectric layer,
the first gate electrode contacts the first side surface of the first insulating separation pattern, and
wherein the second gate electrode contacts the second side surface of the first insulating separation pattern.

14. The semiconductor device of claim 13, wherein the first line structure further comprises a connection spacer extending from the first gate spacer and the second gate spacer,
the connection spacer extends from lower regions of the first and second gate spacers, and
an upper end of the connection spacer is disposed on a level lower than upper ends of the first and second gate spacers and contacts the first insulating separation pattern.

15. The semiconductor device of claim 13, further comprising:
first channel layers stacked on the first active region and spaced apart from each other in a vertical direction perpendicular to an upper surface of the substrate; and
second channel layers stacked on the second active region and spaced apart from each other in the vertical direction,
wherein the first gate pattern surrounds each of the first channel layers,
the second gate pattern surrounds each of the second channel layers,
the first gate dielectric layer comprises a portion disposed between each of the first channel layers and the first gate electrode, and
the second gate dielectric layer comprises a portion disposed between each of the second channel layers and the second gate electrode.

16. The semiconductor device of claim 12, wherein at least one of the first side surface and the second side surface of the first insulating separation pattern comprises a first portion, a second portion on a level lower than the first portion, and a third portion on a level lower than the second portion,
the third portion is disposed in the isolation layer,
the second portion extends from the third portion and has a slope smaller than a slope of the third portion, and
the first portion extends from the second portion and has a slope steeper than the slope of the second portion.

17. A semiconductor device comprising:
a substrate; a first active region and a second active region extending parallel to each other in a first direction, on the substrate;
an isolation layer disposed between the first active region and the second active region;
a plurality of line structures disposed on the substrate, overlapping the first and second active regions and the isolation layer, extending parallel to each other in a second direction perpendicular to the first direction, and spaced apart from each other;

a first source/drain region disposed on the first active region;

a second source/drain region disposed on the second active region;

interlayer insulating layers disposed between adjacent line structures of the plurality of line structures; and a common contact plug, wherein the plurality of line structures comprises a first line structure and a second line structure adjacent to each other and spaced apart from each other, the first line structure comprises:
- a first gate structure overlapping the first active region and extending on the isolation layer,
- a second gate structure overlapping the second active region and extending on the isolation layer, and
- a first insulating separation pattern disposed between the first gate structure and the second gate structure and extending into the isolation layer, the second line structure comprises:
- a third gate structure overlapping the first active region and extending on the isolation layer,
- a fourth gate structure overlapping the second active region and extending on the isolation layer, and
- a second insulating separation pattern disposed between the third gate structure and the fourth gate structure and extending into the isolation layer, the common contact plug comprises a portion contacting the first and second source/drain regions and disposed between the first insulating separation pattern and the second insulating separation pattern, the first insulating separation pattern comprises a first side surface and a second side surface opposing each other in the first direction, and a third side surface and a fourth side surface opposing each other in the second direction, the first side surface of the first insulating separation pattern comprises a first portion, a second portion below the first portion and a third portion below the second portion, the third portion contacts with the isolation layer, the second portion is bent and extended from the first portion in a direction away from a central axis of the first insulating separation pattern, and the first portion is bent and extended from the second portion.

18. The semiconductor device of claim 17, wherein the first gate structure comprises a first gate pattern, a first gate spacer disposed on one side of the first gate pattern, a second gate spacer disposed on another side of the first gate pattern, and a first insulating capping pattern on the first gate pattern and the first and second gate spacers, the second gate structure comprises a second gate pattern, a third gate spacer disposed on one side of the second gate pattern, a fourth gate spacer disposed on another side of the second gate pattern, and a second insulating capping pattern on the second gate pattern and the third and fourth gate spacers, wherein the first gate pattern comprises a first gate dielectric layer and a first gate electrode disposed on the first gate dielectric layer, the second gate pattern comprises a second gate dielectric layer and a second gate electrode disposed on the second gate dielectric layer, the first gate electrode contacts the first side surface of the first insulating separation pattern, the second gate electrode contacts the second side surface of the first insulating separation pattern, the first line structure further comprises a connection spacer extending between the first gate spacer and the third gate spacer, the connection spacer extends from lower regions of the first and second gate spacers, and an upper end of the connection spacer contacts the first insulating separation pattern and is disposed on a level lower than upper ends of the first and second gate spacers.

19. The semiconductor device of claim 18, further comprising:
- first channel layers stacked on the first active region and spaced apart from each other in a vertical direction perpendicular to an upper surface of the substrate; and
- second channel layers stacked on the second active region and spaced apart from each other in the vertical direction, wherein the first gate pattern surrounds each of the first channel layers, the second gate pattern surrounds each of the second channel layers, the first gate dielectric layer comprises a portion disposed between each of the first channel layers and the first gate electrode, and the second gate dielectric layer comprises a portion disposed between each of the second channel layers and the second gate electrode.

20. The semiconductor device of claim 17, wherein in the first direction, the first insulating separation pattern comprises a first width portion having a substantially constant first width, a second width portion having a second width less than the first width, and a third width portion having a third width less than the second width, and the first portion of the first side surface is a side surface of the first width portion of the first insulating separation pattern, the second portion of the first side surface is a side surface of the second width portion of the first insulating separation pattern, and the third portion of the first side surface is a side surface of the third width portion of the first insulating separation pattern.

* * * * *